(12) United States Patent
Banerjee et al.

(10) Patent No.: US 11,721,402 B2
(45) Date of Patent: *Aug. 8, 2023

(54) METHOD AND SYSTEM FOR IMPROVING WORD LINE DATA RETENTION FOR MEMORY BLOCKS

(71) Applicant: Western Digital Technologies, Inc., San Jose, CA (US)

(72) Inventors: Amiya Banerjee, Bangalore (IN); Vinayak Bhat, Bangalore (IN); Nikhil Arora, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/835,502

(22) Filed: Jun. 8, 2022

(65) Prior Publication Data
US 2022/0301645 A1 Sep. 22, 2022

Related U.S. Application Data

(63) Continuation of application No. 17/176,867, filed on Feb. 16, 2021, now Pat. No. 11,386,969.

(51) Int. Cl.
*G11C 16/34* (2006.01)
*G11C 16/30* (2006.01)
(Continued)

(52) U.S. Cl.
CPC .......... *G11C 16/3459* (2013.01); *G11C 16/08* (2013.01); *G11C 16/10* (2013.01);
(Continued)

(58) Field of Classification Search
CPC ..... G11C 16/3459; G11C 16/08; G11C 16/10; G11C 16/26; G11C 16/30; G11C 16/3409;
(Continued)

(56) References Cited

U.S. PATENT DOCUMENTS 9,449,700 B2 9/2016 Shah et al.
9,460,799 B1 10/2016 Costa et al.
(Continued)

*Primary Examiner* — Jay W. Radke
(74) *Attorney, Agent, or Firm* — Ravi Mohan; Rutan & Tucker, LLP

(57) ABSTRACT

Storage devices are capable of utilizing failed bit count (FBC) reduction devices to reduce FBCs for word lines in blocks. An FBC reduction device may include a FBC count component, a threshold component, a pre-verify component, and a soft program component. The FBC count component may access the FBC for the word line, where the block has unprogrammed word lines in an unprogrammed region separated from programmed word lines of a programmed region by the word line. The threshold component may determine whether the FBC of the word line exceeds a predetermined threshold. When the FBC exceeds the threshold, the pre-verify component may perform pre-verify operations on the programmed region. The soft program component may program the word line with first data equal to second data programmed in a second block. In response to disabling pre-verify operations, the program component may program the unprogrammed word lines in the unprogrammed region.

20 Claims, 12 Drawing Sheets

(51) Int. Cl.
  *G11C 16/10* (2006.01)
  *G11C 16/26* (2006.01)
  *G11C 16/08* (2006.01)

(52) U.S. Cl.
  CPC .............. *G11C 16/26* (2013.01); *G11C 16/30* (2013.01); *G11C 16/3409* (2013.01); *G11C 16/3431* (2013.01); *G11C 16/3436* (2013.01)

(58) Field of Classification Search
  CPC ............ G11C 16/3431; G11C 16/3436; G11C 11/5628; G11C 2211/5641; G11C 29/021; G11C 29/028; G11C 29/52
  See application file for complete search history.

(56) References Cited

U.S. PATENT DOCUMENTS

| | | |
|---|---|---|
| 9,530,517 B2 | 12/2016 | Lee et al. |
| 10,089,170 B1 | 10/2018 | Goss et al. |
| 10,559,366 B2 | 2/2020 | Shen et al. |
| 10,613,943 B2 | 4/2020 | Guo et al. |
| 11,386,969 B1 * | 7/2022 | Banerjee ............. G11C 11/5628 |
| 2010/0208523 A1 * | 8/2010 | Marquart ................ G11C 16/16 365/185.29 |
| 2016/0172045 A1 | 6/2016 | Shukla et al. |
| 2018/0122489 A1 | 5/2018 | Ray et al. |
| 2019/0156904 A1 * | 5/2019 | Hong ..................... G11C 16/10 |

* cited by examiner

METHOD AND SYSTEM FOR IMPROVING WORD LINE DATA RETENTION FOR MEMORY BLOCKS

PRIORITY

This application is a continuation and claims priority to U.S. patent application Ser. No. 17/176,867, filed Feb. 16, 2021, which is incorporated herein in its entirety.

FIELD

The embodiments of the present disclosure relate to storage devices. More particularly, the embodiments relate to dynamically handling and improving word line data retention for memory cell blocks.

BACKGROUND

When a block is kept open for a long time, a boundary word line (BWL) or a last programmed word line of the open block (a last gprgrammed row or page of cells along a word line) can become vulnerable to various errors due to the strong electric field. When the open block is closed and maintained for data retention, the BWL typically shows substantially higher fail bit counts (FBCs) than the previously programmed word lines and thereby the BWL generally fails to meet the expected and/or desired performance specifications.

In cases where zone mapping of blocks is used, several thousands of blocks may be required to be kept open or idle for extended periods of time. Due to the data retention constraints associated with the BWL, existing storage devices and systems limit the time duration for which blocks are kept open and/or idle.

These existing data retention limitations can severely impact devices that utilize zone mapping and higher-density memory cells. While zone mapping and higher-density cells reduce costs and increase capacity, these devices are then confronted with other problems due to the increased number of read operations required per memory cell. For example, increased read operations may also lead to increased read disturb (RD) and fail bit counts (FBCs) errors.

Moreover, RD errors can generally increase when reading from open blocks. This may be problematic and substantially time consuming for devices using zone mapping schemes, where a DR check fails during an operation in which most blocks are open and partially programmed, thus requiring a time-consuming relocation of data from the failed open blocks.

BRIEF DESCRIPTION OF DRAWINGS

The above, and other, aspects, features, and advantages of several embodiments of the present disclosure will be more apparent from the following description as presented in conjunction with the following several figures of the drawings. The drawings refer to embodiments of the present disclosure in which.

DETAILED DESCRIPTION

Figure 1A:
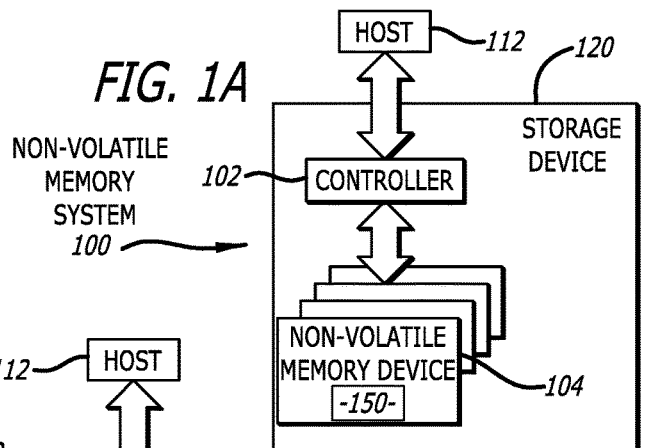
FIG. 1A is an exemplary block diagram illustration of a non-volatile memory system with a FBC reduction component, in accordance with an embodiment of the present disclosure.

The embodiments described herein relate to storage devices, systems, and processes for improving and dynamically handling the data retention of memory blocks. For example, when a block is maintained open for an extended time period, a boundary (or last programmed) word line of the open block may generally become vulnerable to various bit failures due to the strong electric field. As such, when the open block is closed and maintained for data retention, the boundary word line typically has higher failed bit counts (FBCs) (also referred to as flip bit counts, errors, etc.) compared to the previously programmed word lines. Based on these data retention constraints due to the boundary word lines having higher FBCs, the time duration for which the memory blocks are maintained open may be limited. Accordingly, the embodiments described herein may be configured to increase the data retention of the blocks using one or more soft and/or or soft-fine programming operations that significantly reduce the bit failures and FBCs generally associated with the boundary word lines of those blocks.

As described below, these embodiments ultimately facilitate storage devices and systems with the following advantages: (i) eliminating any constraints/limitation associated with open block data retention and compromising to meet the performance requirements for any original equipment manufacturer (OEM) devices; (ii) avoiding any enhanced post-write read (EPWR) failures and firmware overhead failures related to data relocation; (iii) enhancing the boundary word lines by having approximately the lowest FBCs among all other word lines in the blocks; and (iv) enabling any open block conditions for any storage device, as some customers may be interested in having the blocks open for extended time periods, especially for zone mapping storage devices and systems. Additionally, the embodiments described herein may provide several substantial improvements to the existing storage devices and system by overcoming the need to relocate data from those failed open blocks, which encounter bit failures during any data retention checks on the boundary word lines of such blocks that have been kept idle for extended periods of time and/or power cycled. Accordingly, this bit failure reduction, in most embodiments, facilitates the storage devices and systems described herein and substantially improves any data retention schemes by (i) reducing the FBCs of any blocks (e.g., reducing by approximately 10 times or greater), (ii) preventing (or saving) any data relocation time (e.g., saving approximately 3000 seconds or greater), (iii) reducing the write amplification, and (iv) correspondingly increasing the overall performance (e.g., increasing by approximately 2-3% or greater, and/or approximately 5-10% or greater when one or more trim parameter(s) are tuned.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "function," "component," "module," "apparatus," and/or "system." Furthermore, aspects of the present disclosure may take the form of a computer program product embodied in one or more non-transitory computer-readable storage media storing computer-readable and/or executable program code. Many of the functional units described in this specification have been labeled as functions, in order to emphasize their implementation independence more particularly. For example, a function may be implemented as a hardware circuit comprising custom VLSI circuits or gate arrays, off-the-shelf semiconductors such as logic chips, transistors, or other discrete components. A function may also be implemented in programmable hardware devices such as via field programmable gate arrays, programmable array logic, programmable logic devices, or the like.

Functions may also be implemented at least partially in software for execution by various types of processors. An identified function of executable code may, for instance, comprise one or more physical or logical blocks of computer instructions that may, for instance, be organized as an object, procedure, or function. Nevertheless, the executables of an identified function need not be physically located together but may comprise disparate instructions stored in different locations which, when joined logically together, comprise the function and achieve the stated purpose for the function.

Indeed, a function of executable code may include a single instruction, or many instructions, and may even be distributed over several different code segments, among different programs, across several storage devices, or the like. Where a function or portions of a function are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object-oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may be embodied by or implemented as a circuit.

As used herein, a soft erase operation reduces threshold voltages of memory cells to intermediate levels between their initial levels (i.e., programmed levels corresponding to data states) and erased levels. A soft programming operation may return threshold voltages from the intermediate levels back to their respective programmed levels (i.e., generally, to their initial levels, with some corrections and some narrowing of distributions associated with data states). As such, a soft-fine programming operation may be performed on a quad-level cell block (or a penta-level cell block) to narrow the distribution of erased threshold voltages for the erased memory cells. Likewise, a soft programming operation may be performed on a triple-level cell block (or lower density cell blocks) to narrow the distribution of erased threshold voltages for those erased memory cells. Some memory cells may be in a deeper erased state than necessary as a result of the erase process. Soft-fine and/or soft programming operations may apply programming pulses to move the respective threshold voltages of the deeper erased memory cells to their respective erase threshold distributions. However, it should be understood that any particular cell block type, such as SLC, MLC, TLC, QLC, PLC, and so on, may be programmed by any of the soft-fine and soft programming operations described herein, without limitation.

For example, as described in greater detail below, a FBC reduction device (or the like) may be configured to implement soft and/or soft-fine programming operations on any boundary word lines, where the soft/soft-fine programming operations may thereby program the boundary word lines with the same data as the data that is still available in the respective source single-level cell blocks (or the respective second/source block). For example, as described in greater detail below, the second (or source) block may be a SLC as well as a MLC, TLC, QLC, PLC, and so on, alternatively the second block may also be the original block itself in which the error was detected. In these examples, the soft/soft-fine programming operation may be configured to tunnel a particular number of electrons into a charge trapping layer of a particular boundary word line, and hence the required number of electrons and threshold voltage(s) may be maintained for that particular boundary word line.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to", unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Further, as used herein, reference to reading, writing, storing, buffering, and/or transferring data can include the entirety of the data, a portion of the data, a set of the data, and/or a subset of the data. Likewise, reference to reading, writing, storing, buffering, and/or transferring non-host data can include the entirety of the non-host data, a portion of the non-host data, a set of the non-host data, and/or a subset of the non-host data.

Finally, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps, or acts are in some way inherently mutually exclusive.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Figure 1B:
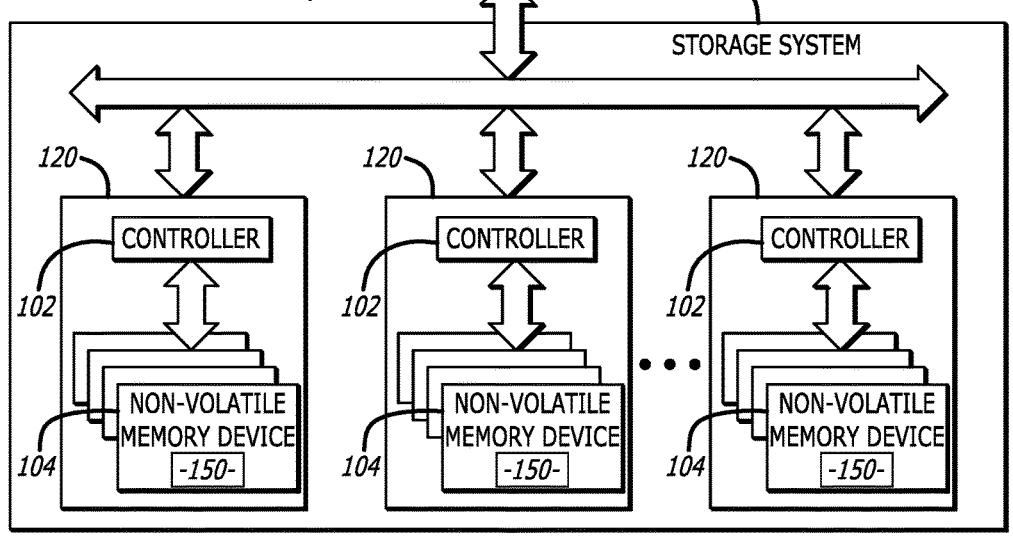
FIG. 1B is an exemplary block diagram illustration of a storage module with a storage system with a FBC reduction component, in accordance with an embodiment of the present disclosure.
Figure 1C:
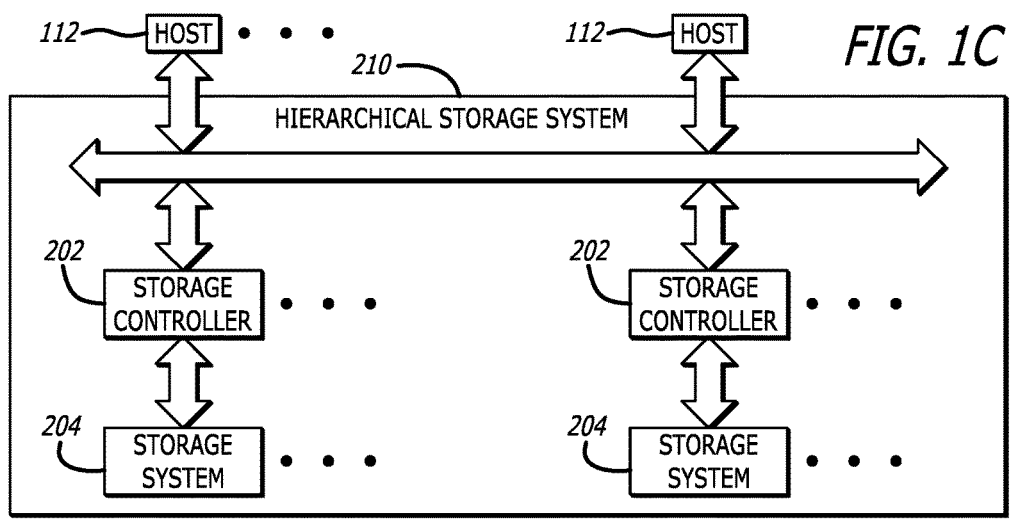
FIG. 1C is an exemplary block diagram illustration of a hierarchical storage system with a FBC reduction component, in accordance with an embodiment of the present disclosure.

Examples of suitable non-volatile memory arrangements in which the systems and methods disclosed herein may be used are illustrated in FIGS. 1A-1C. That is, the following embodiments disclose non-volatile memory systems and devices and processes for improving DR of open blocks with soft program operations to significantly reduce the FBCs of any identified word lines in the open blocks. Before turning to these and other embodiments, the following paragraphs provide some exemplary non-volatile memory systems, storage devices, and storage modules that can be used with such embodiments. It will be appreciated that any other suitable embodiments of non-volatile memory systems, devices, and/or storage modules may be used alone or in combination therewith, without limitation.

Referring now to FIG. 1A, an exemplary block diagram of a non-volatile memory system 100 is shown, in accordance with embodiments of the disclosure. The non-volatile memory system 100 includes a storage device 120 (or a non-volatile storage device) with a controller 102 and a non-volatile memory that may be comprised of one or more non-volatile memory device 104 (also referred to as NV memory, memory, memory dies, and so on). In some embodiments, the non-volatile memory device 104 may include a set of non-volatile memory cells—and associated circuitry (or logic) for managing the physical operation of those non-volatile memory cells—that are formed on a single semiconductor substrate. For example, the associated circuitry of the non-volatile memory device 104 may include one or more FBC reduction devices 150 configured to increase the overall data retention of any data blocks within the non-volatile memory device 104 by implementing one or more soft program operations that significantly reduce the FBCs of any identified word lines in such blocks.

In some embodiments, the controller 102 interfaces with a host 112 and transmits command sequences for read, program, and erase operations to the non-volatile memory device 104. The controller 102 may take the form of processing circuitry, a microprocessor or processor, and a computer-readable medium that stores computer-readable program code (e.g., software or firmware) executable by the (micro)processor, logic gates, switches, an ASIC, a programmable logic controller, and an embedded microcontroller, for example. The controller 102 may be configured with various hardware and/or firmware to perform the various functions described below and shown in the flow diagrams. Also, some of the components shown as being internal or external to the controller 102 can be respectively stored external or internal to the controller, and other components can be used. For example, the associated circuitry of the controller 102 may include one or more FBC reduction devices, such as the FBC reduction devices 150, configured to substantially increase the overall DR of the non-volatile memory device 104 one or more soft program operations that significantly reduce the FBCs of any identified word lines in any desired data blocks, as described below in further detail.

In some embodiments, the controller 102 may be a flash memory controller or the like. A flash memory controller may be a device that manages data stored on flash memory and communicates with a host, such as a computer or electronic device. A flash memory controller can have functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. Note that, alternatively, the host may provide the physical address. The flash memory controller can also perform various memory management functions, such as, but not limited to, wear leveling (i.e., distributing writes to avoid wearing out specific blocks of memory that would otherwise be repeatedly written to), garbage collection (i.e., after a block is full, moving only the valid pages of data to a new block, so the full block can be erased and reused), and/or any other similar memory management functions.

The interface between the controller 102 and the non-volatile memory device 104 may be any suitable flash interface, such as a double data rate (DDR) interface or the like. In one embodiment, the non-volatile memory system 100 may be a card-based system, such as a secure digital (SD) or a micro secure digital (micro-SD) card. In an alternate embodiment, the non-volatile memory system 100 may be part of an embedded memory system.

The non-volatile memory device 104 may include any suitable storage device, medium, or element, including NAND flash memory cells and/or NOR flash memory cells. The memory cells can take the form of solid-state (e.g., flash) memory cells and can be one-time programmable, few-time programmable, or many-time programmable. Additionally, as noted above, the memory cells can also be single-level cells (SLCs), multi-level cells (MLCs), triple-level cells (TLCs), quad-level cells (QLCs), penta-level cells (PLCs), and/or use any other memory technologies, now known or later developed. Also, the memory cells can be arranged in a two-dimensional or three-dimensional configuration, without limitation.

In many embodiments, the FBC reduction device 150 may be configured to increase the data retention of memory blocks using soft and/or soft-fine program operations that may significantly reduce the FBCs of one or more word lines within those blocks. For example, the FBC reduction device 150 may provide a scheme for improving and dynamically handling the data retention of one or more boundary word lines in an open block. In most embodiments, the FBC reduction device 150 may be configured to check the FBCs for the boundary word lines prior to closing the open block. For example, if the FBC is less than a predetermined threshold value, the remaining WLs of the block are programmed. If the FBC is greater than the threshold value, the FBC reduction device 150 may be configured to enable and perform a pre-verify operation on one or more word lines in the respective program region of the open block. For example, the pre-verify operation may identify the cells and/or word lines, which have reached their desired programming states and thereby inhibits the corresponding bit lines so that they are not over-programmed at the following soft/soft-fine programming operation.

Furthermore, the FBC reduction device 150 may be configured to implement the soft and/or soft-fine programming operation on the boundary word line, where the boundary word line may be programmed with the same data as the data that is still available in the respective source SLC block. For example, the soft/soft-fine programming operation may tunnel a particular number of electrons into a charge trapping layer of the boundary word line, and hence the required number of electrons and threshold voltages may be maintained. Also, in several embodiments, the soft/soft-fine programming operation may be controlled by tuning a delta program voltage, a number of pre-verify operations, and so on. Lastly, in most embodiments after the soft/soft-fine programming operation is completed, the FBC reduction device 150 may be configured to disable the pre-verify operation and then continue programming the remaining unprogrammed word lines of the open block.

Additionally, it should be noted that as shown in FIG. 1A, the non-volatile memory system 100 includes a single channel between the controller 102 and the non-volatile memory device 104. Although the illustrated embodiment shows a single-memory channel, any number of channels may be utilized without exceeding beyond the spirit and scope of the present disclosure. For example, in some NAND memory system architectures, 2, 4, 8 or more NAND channels may exist between the controller 102 and the NAND memory device(s) based on the controller capabilities. As such, in any of the other embodiments described herein, a single channel and/or two or more channels may exist between the controller and the memory die(s), even if a single channel is shown in the drawings.

Referring now to FIG. 1B, an exemplary block diagram of a storage module 200 is shown, in accordance with embodiments of the disclosure. The storage module 200 includes a storage system 204 having a plurality of storage devices 120, in accordance with some embodiments. As such, the storage module 200 may include one or more non-volatile memory systems similar to the non-volatile memory system 100 in FIG. 1A. In some embodiments, the storage module 200 may include a storage controller 202 that interfaces with the host 111 and the storage system 204, which includes the non-volatile memory systems comprised of the storage devices 120, the non-volatile memory devices with the FBC reduction devices 150, and the controllers 102. The interface between storage controller 202 and the non-volatile memory device 104 memory systems (or the storage devices 120) may be a bus interface, such as a serial advanced technology attachment (SATA) or peripheral component interface express (PCIe) interface. In some embodiments, the storage module 200 may be a solid-state drive (SSD), as found in portable computing devices, such as laptop computers, and tablet computers.

Referring now to FIG. 1C, an exemplary block diagram of a hierarchical storage system 210 is shown, in accordance with embodiments of the disclosure. In some embodiments, the hierarchical storage system 210 may include a plurality of storage controllers 202, each of which control a respective storage system 204. Additionally, the hierarchical storage system 210 may be communicatively coupled to one or more hosts 112 (or hosts systems) that may access memories within the hierarchical storage system 210 via a bus interface (or the like). In one embodiment, the bus interface may be a non-volatile memory express (NVMe), a fiber channel over Ethernet (FCoE) interface, or the like. In one embodiment, the hierarchical storage system 210 illustrated in FIG. 1C may be a rack mountable mass storage system that is accessible by multiple host computers, as would be found in a data center or other locations where mass storage is needed.

Figure 2:
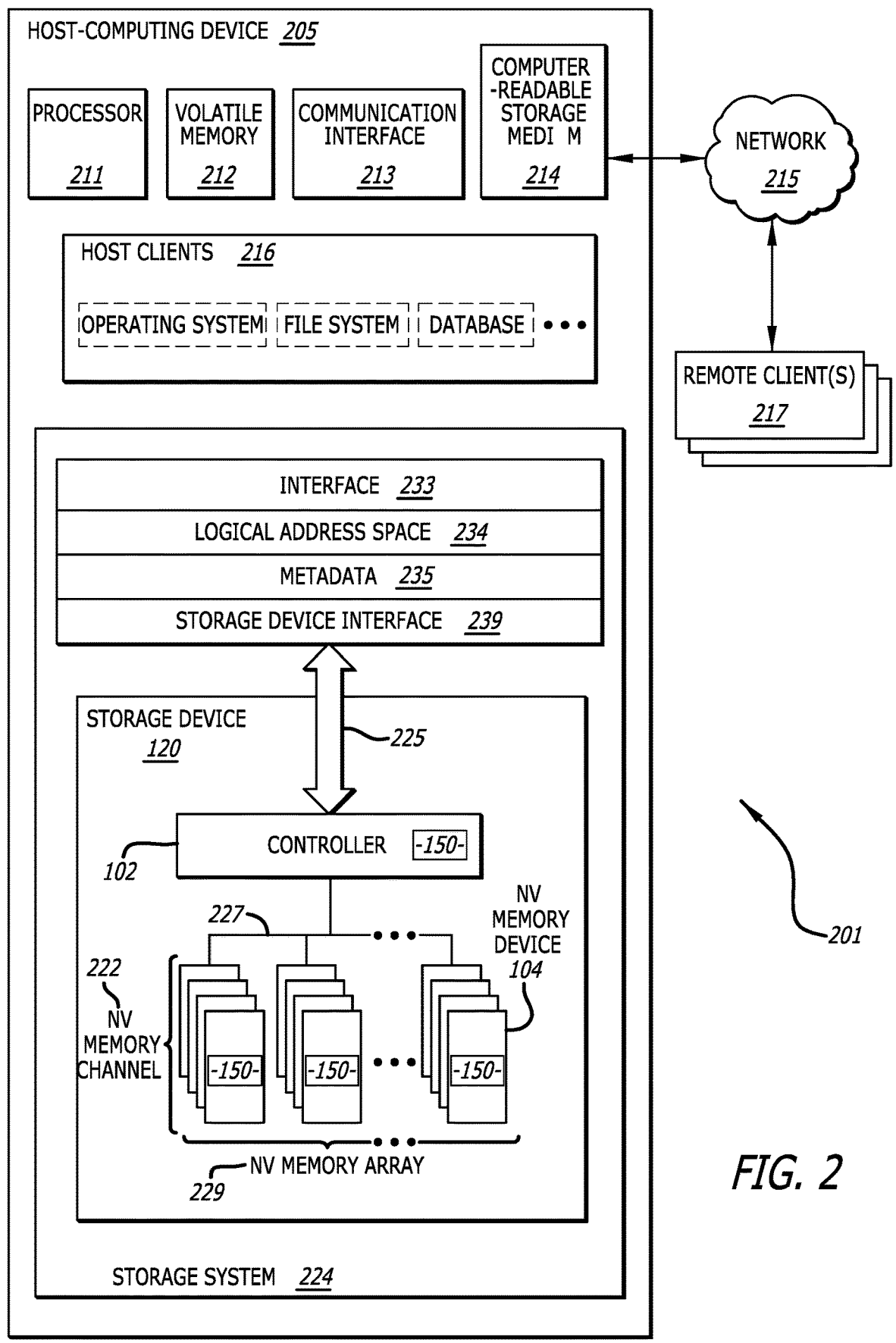
FIG. 2 is a schematic block diagram illustration of a system with a host-computing device and a storage device with a FBC reduction component, in accordance with an embodiment of the present disclosure.

Referring now to FIG. 2, a schematic block diagram of a computing system 201 with a host-computing device 205 and a storage system 224 is shown, in accordance with embodiments of the disclosure. The computing system 201 may include one or more storage devices 120 with one or more FBC reduction devices 150 in the storage system 224 that is communicatively coupled to the host-computing device 205 via a controller 102. The FBC reduction devices 150 may be substantially similar to the FBC reduction devices 150 depicted in FIGS. 1A-B. Likewise, the host-computing device 205 may be similar to the host 112 described above with regard to FIGS. 1A-C. The host-computing device 205 may include a processor 211, a volatile memory 212, and a communication interface 213. The processor 211 may include one or more central processing units, one or more general-purpose processors, one or more application-specific processors, one or more virtual processors (e.g., the host-computing device 205 may be a virtual machine operating within a host), one or more processor cores, or the like. The communication interface 213 may include one or more network interfaces configured to communicatively couple the host-computing device 205 and/or controller 102 of the storage device 120 to a network 215 (or a communication network), such as an Internet Protocol (IP) network, a Storage Area Network (SAN), a wireless or wired network, or the like.

In some embodiments, the storage device 120 may be disposed in one or more different locations relative to the host-computing device 205. In other embodiments, the storage device 120 may be disposed strictly within the storage system 224, where the storage system 224 and the host-computing device 205 are separate components that communicate over a bus or the like. In one embodiment, the storage device 120 comprises one or more non-volatile memory devices (or dies) 104 with the FBC reduction devices 150, such as any type of semiconductor devices and/or other similarly integrated circuit devices disposed on one or more PCBs, storage housings, and/or other mechanical and/or electrical support structures. For example, the storage device 120 may include the FBC reduction devices 150, one or more direct inline memory module (DIMM) cards, one or more expansion cards and/or daughter cards, a SSD or other hard drive device, and/or may have another memory and/or storage form factor. The storage device 120 may be integrated with and/or mounted on a motherboard of the host-computing device 205, installed in a port and/or slot of the host-computing device 205, installed on a different host-computing device 205 and/or a dedicated storage appliance on the network 215, in communication with the host-computing device 205 over an external bus (e.g., an external hard drive or the like), or the like.

In additional embodiments, the storage device 120 may be disposed on a memory bus of a processor 211 (e.g., on the same memory bus as the volatile memory 212, on a different memory bus from the volatile memory 212, in place of the volatile memory 212, or the like). In a further embodiment, the storage device 120 may be disposed on a peripheral bus of the host-computing device 205, such as a peripheral component interconnect express (PCI Express or PCIe) bus such as, but not limited to, a NVMe interface, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the storage device 120 may be disposed on a network 215, such as an Ethernet network, an Infiniband network, SCSI RDMA over a network, a storage area network (SAN), a local area network (LAN), a wide area network (WAN) such as the Internet, another wired and/or wireless network, or the like.

The host-computing device 205 may further comprise computer-readable storage medium 214. The computer-readable storage medium 214 may comprise executable instructions configured to cause the host-computing device 205 (e.g., processor 211) to perform steps of one or more of the methods disclosed herein. Additionally, or in the alternative, the buffering component 250 may be embodied as one or more computer-readable instructions stored on the computer-readable storage medium 214.

For some embodiments, the controller 102 (or a device driver) may present a logical address space 234 to the host clients 216. The logical address space 234 may comprise a plurality (e.g., range) of logical addresses. The logical address space 234 may refer to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

The controller 102 (or the driver) of the storage device 120 may maintain metadata 235, such as a logical to physical address mapping structure, to map logical addresses of the logical address space 234 to media storage locations on the storage device(s) 120. The controller 102 may be configured to provide storage services to one or more host clients 216. The host clients 216 may include local clients operating on the host-computing device 205 and/or remote clients 217 (or remote host clients) accessible via the network 215 and/or communication interface 213. The host clients 216 may include, but are not limited to: operating systems, file systems, database applications, server applications, kernel-level processes, user-level processes, applications, and the like.

The controller 102 may be further communicatively coupled to one or more storage systems 224 that may include different types and configurations of storage devices 120 such as, but not limited to, solid-state storage devices, semiconductor storage devices, SAN storage resources, or the like. The one or more storage devices 120 may comprise one or more respective controllers 102 and non-volatile memory channels 222. The controller 102 may provide access to the one or more storage devices 120 via any compatible protocols or interface 233 such as, but not limited to, SATA and PCIe. The metadata 235 may be used to manage and/or track data operations performed through the protocols or interfaces 233. The logical address space 234 may comprise a plurality of logical addresses, each corresponding to respective media locations of the one or more storage devices 120. The controller 102 may maintain metadata 235 comprising any-to-any mappings between logical addresses and media locations.

The controller 102 may further comprise and/or be in communication with a storage device interface 239 configured to transfer data, commands, and/or queries to the one or more storage devices 120 over a bus 225, which may include, but is not limited to, a memory bus of a processor 211, a PCI Express or PCIe bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 215, Infiniband, SCSI RDMA, or the like. The storage device interface 239 may communicate with the one or more storage devices 120 using input-output control (IO-CTL) command(s), IO-CTL command extension(s), remote direct memory access, or the like.

The communication interface 213 may comprise one or more network interfaces configured to communicatively couple the host-computing device 205 and/or the controller 102 to a network 215 and/or to one or more remote clients 217. The controller 102 may be part of and/or in communication with the one or more storage devices 120. Also, although FIG. 2 illustrates a single storage device 120, the computing system 201 and/or the storage system 224 are not limited in this regard and could be adapted to incorporate any number of storage devices 120.

The storage device 120 may comprise one or more non-volatile memory devices 104 of non-volatile memory channels 222, which may include, but is not limited to, ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silico-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more non-volatile memory devices 104 of the non-volatile memory channels 222, in certain embodiments, may comprise storage class memory (SCM) (e.g., write in place memory, or the like).

While the non-volatile memory channels 222 may be referred to as "memory media" in various embodiments, the non-volatile memory channels 222 may more generally comprise one or more non-volatile recording media capable of recording data that may be referred to as a non-volatile memory medium, a non-volatile storage medium, or the like. Further, the storage device 120, in various embodiments, may comprise a non-volatile recording device, a non-volatile memory array, a plurality of interconnected storage devices in an array, or the like.

The non-volatile memory channels 222 may comprise one or more non-volatile memory devices 104 along with the FBC reduction devices 150, which may include, but are not limited to, chips, packages, planes, dies, and/or the like. The controller 102 may be configured to manage data operations on the non-volatile memory channels 222, and may comprise one or more processors, programmable processors (e.g., FPGAs), ASICs, micro-controllers, or the like. In some embodiments, the controller 102 may be configured to store data on and/or read data from the non-volatile memory channels 222, to transfer data to/from the storage device 120, and so on. For example, as shown in FIG. 2, the controller 102 may include one or more FBC reduction devices 150 that may be used to facilitate the controller 102 to store data on and/or read data from the non-volatile memory channels 222, to transfer data to/from the storage device 120, and so on.

The controller 102 may be communicatively coupled to the non-volatile memory channels 222 by way of a bus 227. The bus 227 may comprise an I/O bus for communicating data to/from the non-volatile memory devices 104 along with the FBC reduction devices 150. The bus 227 may further comprise a control bus for communicating addressing and other command and control information to the non-volatile memory devices 104 along with the FBC reduction devices 150. In some embodiments, the bus 227 may communicatively couple the non-volatile memory devices 104 along with the FBC reduction devices 150 to the controller 102 in parallel. This parallel access may allow the non-volatile memory devices 104 along with the FBC reduction devices 150 to be managed as a group, forming a non-volatile memory array 229. The non-volatile memory devices 104 along with the FBC reduction devices 150 may be partitioned into their respective logical memory units (e.g., logical pages) and/or logical memory divisions (e.g., logical blocks and logical planes). The logical memory units may be formed by logically combining physical memory units of each of the non-volatile memory devices 104 and/or the FBC reduction devices 150.

The controller 102 may organize a block of word lines within one or more of the non-volatile memory devices 104, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within one or more of the non-volatile memory devices 104 may be physically arranged in a monotonically increasing sequence of word line addresses, with consecutively addressed word lines also being physically adjacent (e.g., as shown below in FIG. 4 with WL0, WL1, WL2, . . . WLN).

The controller 102 may compromise and/or be in communication with a device driver that is being executed on the host-computing device 205. For example, the controller 102 and/or such device driver may provide storage services to the host clients 216 via one or more interfaces 233. Likewise, the controller 102 and/or such device driver may further comprise a storage device interface 239 that is configured to transfer data, commands, and/or queries to the controller 102 over the bus 225, as described above.

The FBC reduction device 150 may be part of and/or in communication with the controller 102, the non-volatile memory devices 104, and/or the like. The FBC reduction device 150 may operate on the storage system 224 of the host-computing device 205. In some embodiments, or alternative embodiments, the FBC reduction device 150 may be embodied as one or more computer readable instructions stored on the computer-readable storage medium 214.

In some embodiments, the FBC reduction device 150 may comprise logic hardware of one or more components of the storage device 120, such as the controller 102, the non-volatile memory devices 104 (or elements), a device controller, a field-programmable gate array (FPGA) or other programmable logic, firmware for an FPGA or other programmable logic, microcode for execution on a microcontroller, an ASIC, and/or the like. In other embodiments, the FBC reduction device 150 may comprise executable software code, such as a device driver or the like, stored on the computer-readable storage medium 214 for execution on the processor 211. In further embodiments, the FBC reduction device 150 may include a combination of both executable software code and logic hardware.

Figure 3A:
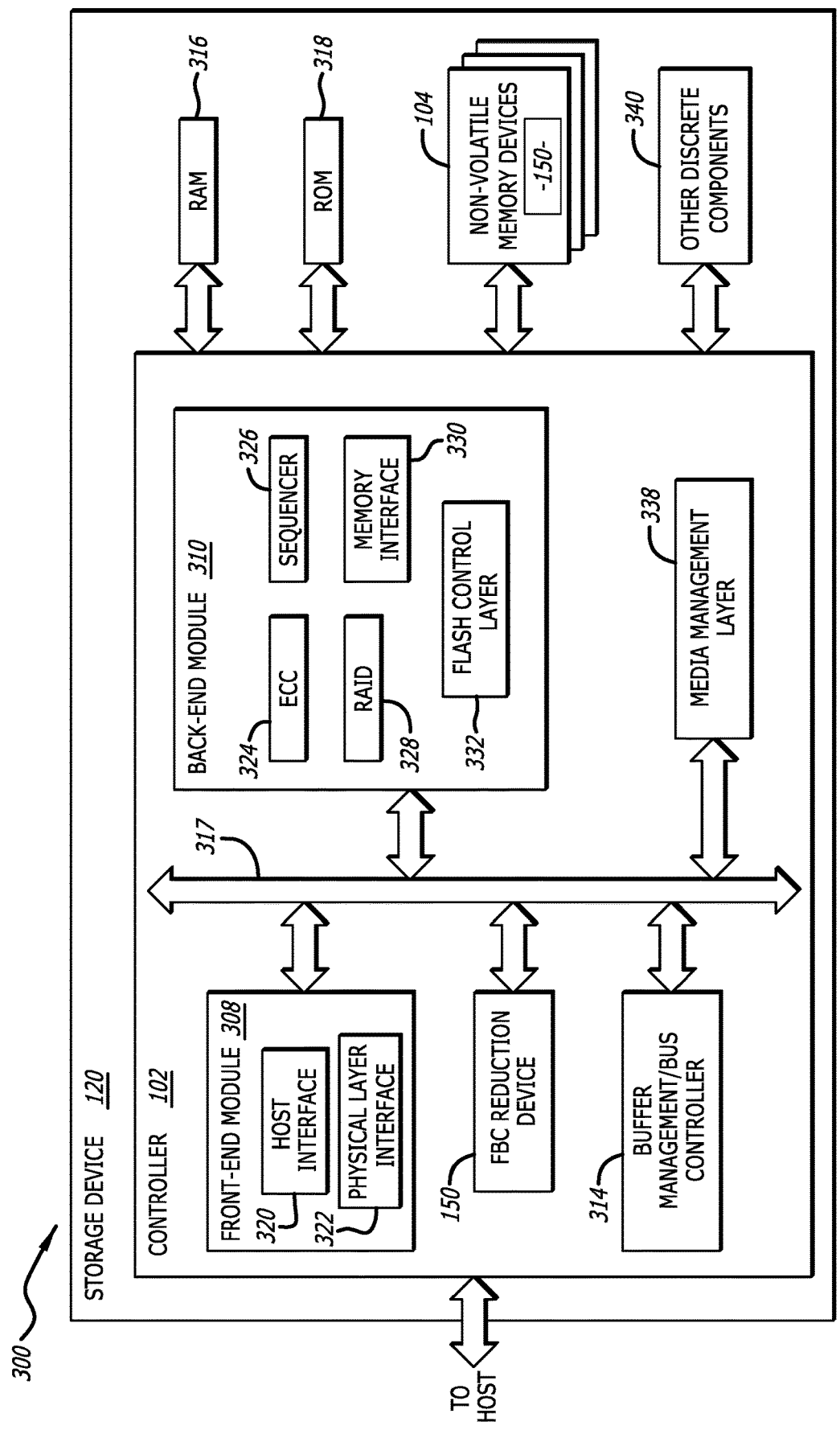
FIG. 3A is a schematic block diagram illustration of an embodiment of a controller of a storage device configured to increase data retention in open blocks with a FBC reduction component, in accordance with an embodiment of the present disclosure.

Referring now to FIG. 3A, a schematic block diagram of a system 300 with exemplary components of the storage device 120 is shown, in accordance with embodiments of the disclosure. The controller 102 may include a front-end module 308 that interfaces with a host, a back-end module 310 that interfaces with the non-volatile memory device(s) (or die(s)) 104 along with the FBC reduction devices 150, and various other modules that perform various functions of the non-volatile memory system 100. In some embodiments, the controller 102 may include one or more FBC reduction devices 150 similar to the FBC reduction devices 150 of the non-volatile memory devices 104. The storage device 120 may include the non-volatile memory devices 104 in conjunction with the FBC reduction devices 150 that are communicatively coupled to the controller 102. The FBC reduction devices 150 in FIG. 3A may be substantially similar to the FBC reduction devices 150 depicted in FIGS. 1A-B and 2.

In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition, or alternatively, each module may include memory hardware that comprises instructions executable with a processor or processor circuitry to implement one or more of the features of the module. When any of the one or more modules includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer management/bus controller 314 that manages buffers in random access memory (RAM) 316 and controls the internal bus arbitration for communication on an internal communications bus 317 of the controller 102. A read only memory (ROM) 318 may store and/or access system boot code. Also, although both the RAM 316 and ROM 318 in FIG. 3A are illustrated as located separately from the controller 102, the RAM 316 and/or the ROM 318 may be located within the controller 102 in other embodiments. In yet another embodiment, portions of the RAM 316 and/or the ROM 318 may be located both within the controller 102 and outside the controller 102. Further, in some implementations, the controller 102, the RAM 316, and the ROM 318 may be located on separate semiconductor devices (or dies).

Additionally, the front-end module 308 may include a host interface 320 and a physical layer interface 322 that provide the electrical interface with the host or next level storage controller. The choice of the type of the host interface 320 can depend on the type of memory being used. Examples types of the host interface 320 may include, but are not limited to, SATA, SATA Express, SAS, Fibre Channel, USB, PCIe, and NVMe. The host interface 320 may typically facilitate transfer for data, control signals, and timing signals.

The back-end module 310 may include an error correction controller (ECC) engine 324 that encodes the data bytes received from the host and decodes and error corrects the data bytes read from the non-volatile memory device(s) 104 along with the FBC reduction devices(s) 150. As discussed below, the ECC engine 324 may be tunable, so as to generate varying amounts of ECC data based on the mode (e.g., generate normal mode ECC data in normal programming mode and generate mixed mode ECC data in mixed mode programming mode, with the mixed mode ECC data being greater than the normal mode ECC data). The back-end module 310 may also include a command sequencer 326 that generates command sequences, such as program, read, and erase command sequences, to be transmitted to the non-volatile memory device(s) 104 along with the FBC reduction devices(s) 150.

Additionally, the back-end module 310 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 328 may be a part of the ECC engine 324. A memory interface 330 provides the command sequences to the non-volatile memory device(s) 104 along with the FBC reduction devices(s) 150 and receives status information from the non-volatile memory device(s) 104 along with the FBC reduction devices(s) 150. In addition to the command sequences and status information, data to be programmed into and read from the non-volatile memory device(s) 104 along with the FBC reduction devices(s) 150 may be communicated through the memory interface 330. In one embodiment, the memory interface 330 may be a double data rate (DDR) interface. A flash control layer 332 may control the overall operation of the back-end module 310.

Additional modules of the non-volatile memory system 100 illustrated in FIG. 2A may include a media management layer 338, which performs wear leveling of memory cells of the non-volatile memory device 104. The non-volatile memory system 100 may also include other discrete components 340, such as external electrical interfaces, external RAM, resistors, capacitors, or other components that may interface with controller 102. In alternative embodiments, one or more of the RAID modules 328, media management layer 338, and the buffer management/bus controller 314 are optional components that may not be necessary in the controller 102.

Figure 3B:
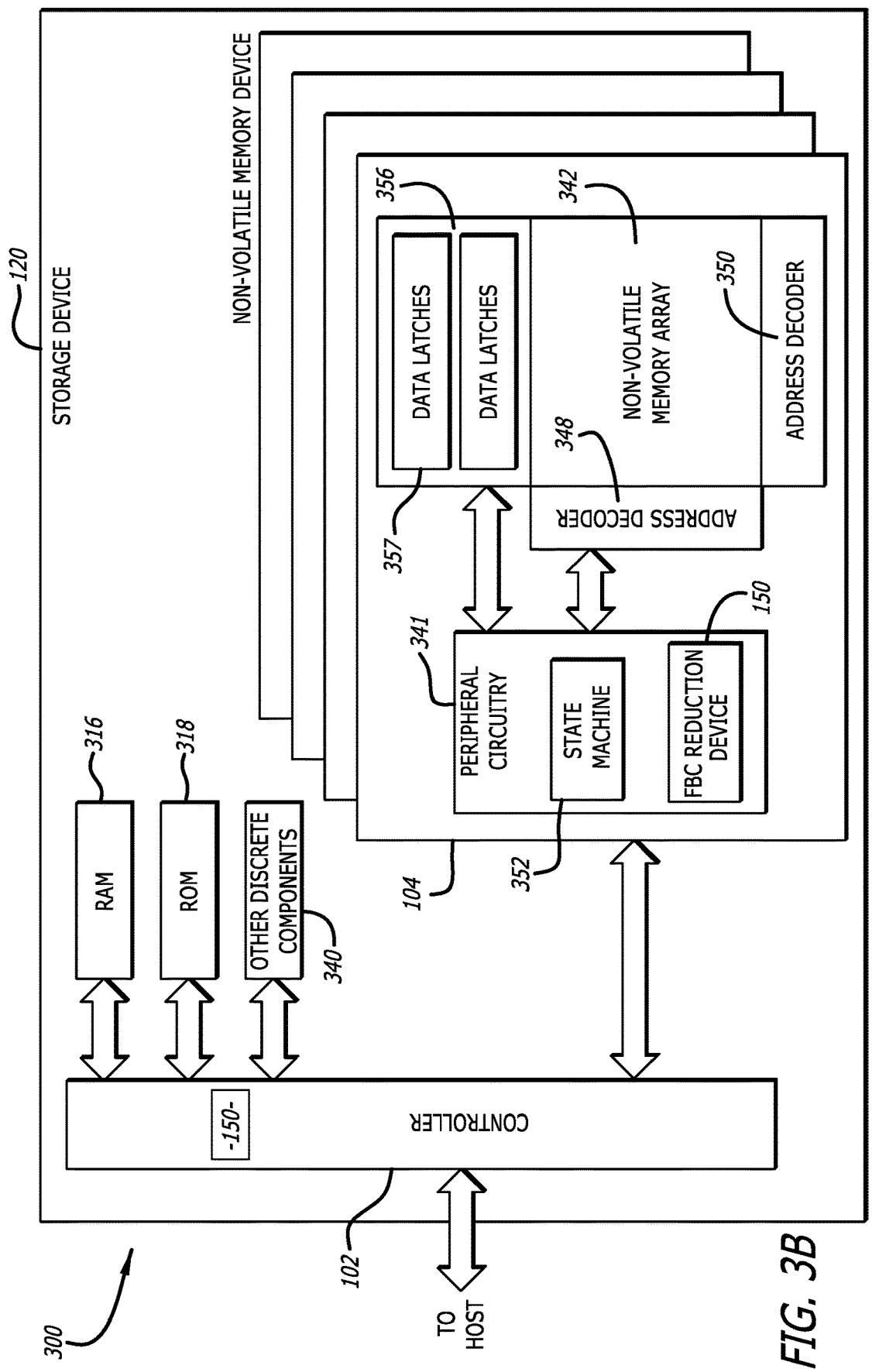
FIG. 3B is a schematic block diagram illustration of an embodiment of a non-volatile memory device of a storage device configured to increase data retention in open blocks with a FBC reduction component, in accordance with an embodiment of the present disclosure.

Referring now to FIG. 3B, the system 300 with exemplary components of the storage device 120 is shown, in accordance with embodiments of the disclosure. The storage device 120 may be communicatively coupled to a host with the controller 102. The controller 102 may include one or more FBC reduction devices 150. The non-volatile memory device 104 may include one or more FBC reduction devices 150. The FBC reduction devices 150 in FIG. 3B may be substantially similar to the FBC reduction devices 150 depicted in FIGS. 1A-B, 2, and 3A. In most embodiments, the FBC reduction devices 150 of the controller 102 may be substantially similar to the FBC reduction devices 150 of the non-volatile memory device 104. While, in other embodiments, the FBC reduction devices 150 of the controller 102 may be different from the FBC reduction devices 150 of the non-volatile memory device 104.

The non-volatile memory device 104 may also include a non-volatile memory array 342. The non-volatile memory array 342 may include a plurality of non-volatile memory elements or cells, each configured to store one or more bits of data. The non-volatile memory elements or cells may be any suitable non-volatile memory cells, including NAND flash memory cells and/or NOR flash memory cells in a two-dimensional configuration and/or a three-dimensional configuration. The memory cells may take the form of solid-state (e.g., flash) memory cells and can be one-time programmable, few-time programmable, or many-time programmable. In addition, as described above, the memory elements or cells may be configured as SLCs that store a single bit of data per cell, multi-level cells MLCs that store multiple bits of data per cell, or combinations thereof. For example, in these embodiments, the MLCs include TLCs, QLCs, and so on, that store three, four, and more than four bits of data per cell.

Additionally, a flash memory cell may include within the non-volatile memory array 342 a floating gate transistor (FGT) that has a floating gate and a control gate. The floating gate is surrounded by an insulator or insulating material that helps retain charge in the floating gate. The presence or absence of charges inside the floating gate may cause a shift in a threshold voltage of the FGT, which is used to distinguish logic levels. That is, each FGT's threshold voltage may be indicative of the data stored in the memory cell.

Hereafter, FGTs, memory elements, and memory cells may be used interchangeably to refer to the same physical entity.

For example, the SLCs and the MLCs may be disposed in the non-volatile memory array 342 in accordance with a matrix-like structure of rows and columns of memory cells. At the intersection of a row and a column is a FGT (or memory cell). A column of FGTs may be referred to as a string. FGTs in a string or column may be electrically connected in series, whereas, a row of FGTs may be referred to as a page. Control gates of FGTs in a page or row may be electrically connected or otherwise coupled together.

The non-volatile memory array 342 may also include word lines and bit lines connected to the FGTs. Each page of FGTs is coupled to a word line. In particular, each word line may be coupled to the control gates of FGTs in a page. In addition, each string of FGTs may be coupled to a bit line. Further, a single string may span across multiple word lines, and the number of FGTs in a string may be equal to the number of pages in a block.

In some embodiments, the non-volatile memory devices 104 may include a peripheral circuitry 341 with the one or more FBC reduction device(s) 150 and one or more state machines 352 that may provide high speed read performances and status information respectively to the controller 102. The non-volatile memory device 104 may further includes a data cache 356 that caches data. The non-volatile memory device 104 may also include a row address decoder 348 and a column address decoder 350. The row address decoder 348 may decode a row address and select a particular word line in the non-volatile memory array 342 when reading or writing data to/from the memory cells in the non-volatile memory array 342. The column address decoder 350 may decode a column address to select a particular group of bit lines in the non-volatile memory array 342 to be electrically coupled to the data cache 344.

The data cache 356 may include sets of data latches 357 for each bit of data in a memory page of the non-volatile memory array 342. Thus, each set of data latches 357 may be a page in width, and a plurality of sets of data latches 357 may be included in the data cache 356. Additionally, in other embodiments, the controller 102 may be implemented in as a single integrated circuit chip and may communicate with the one or more different layers of memory in the non-volatile memory device 104 along with the FBC reduction device 150 over one or more command channels. Note that, in other embodiments, controller executable code for implementing memory management instructions as described herein may be stored in the non-volatile flash memory.

Moreover, as described herein, the non-volatile memory array 342 may be arranged in blocks of memory cells in which one block of memory cells is the unit of erase, i.e., the smallest number of memory cells that are physically erasable together. For increased parallelism, however, the blocks may be operated in larger metablock (MB) units. One block from each of at least two planes of memory cells may be logically linked together to form a metablock.

Figure 4:
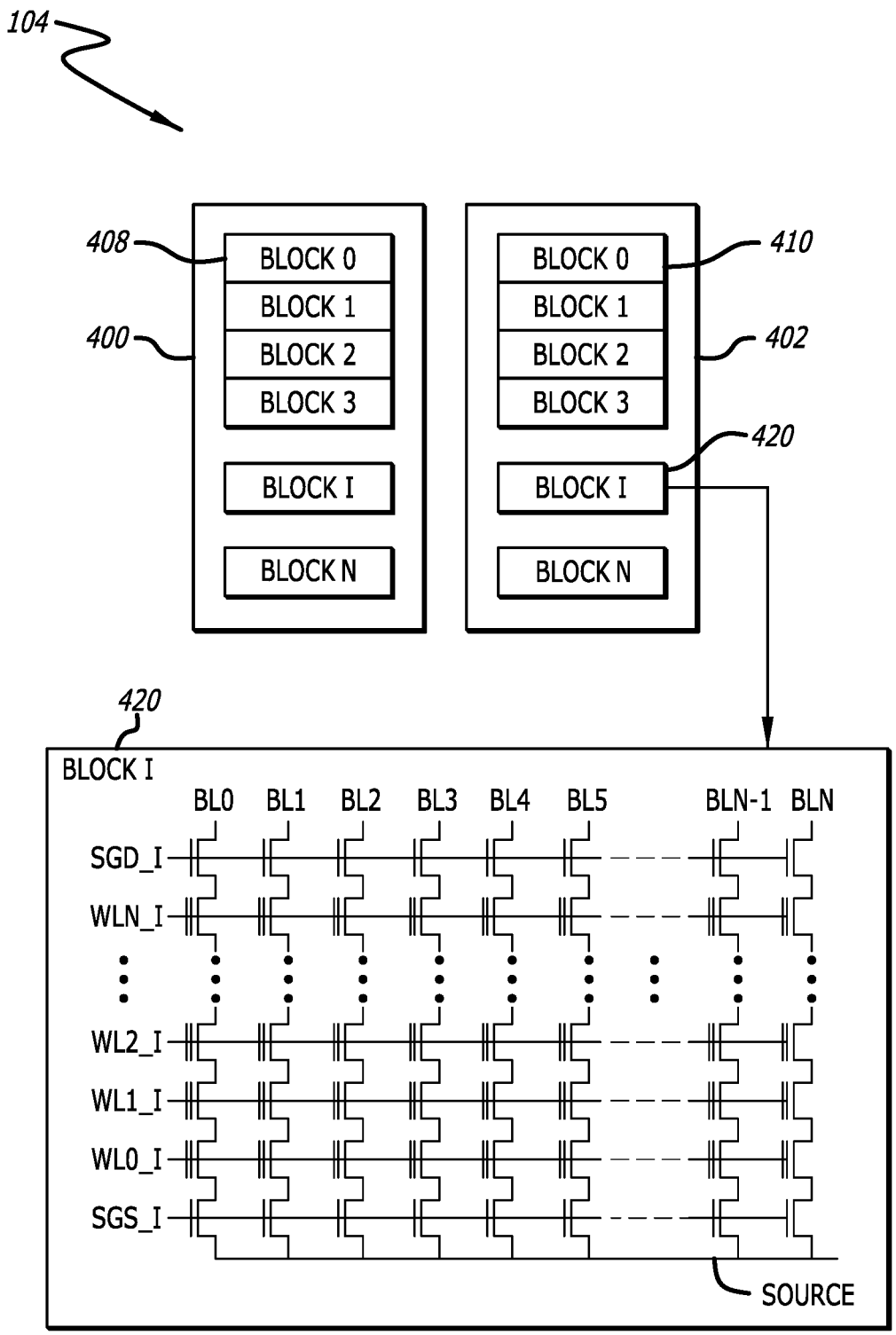
FIG. 4 is an exemplary block diagram illustration of planes and data blocks in a memory cell array structure, in accordance with an embodiment of the present disclosure.

Referring now to FIG. 4, a block diagram illustration of two planes 400 and 402 is shown, in accordance with some embodiments. An array of memory cells may be divided into multiple planes. For example, as shown in FIG. 4, the non-volatile memory device 104 may include a non-volatile memory array, such as the non-volatile memory array 342 in FIG. 3A, that may be divided into planes 400 and 402. That is, the planes 400 and 402 depicted in FIG. 4 may be a part of the non-volatile memory device 104 depicted in FIGS. 1A-B, 2, and 3A-3B (and/or a part of any other similar memory structure), where the non-volatile memory device 104 may include the planes 400 and 402 in conjunction with a plurality of other planes.

The planes 400 and 402 may be divided into a large number of blocks 408, 410, and 420 (e.g., Blocks 0-1023, Blocks 0-4096, and/or Blocks 0-N, where N is any number of total blocks that are used). Each block 408, 410, and 420 includes a plurality of memory cells. Furthermore, each block 408, 410, and 420 is the unit of erase and, therefore, is sometimes referred to as an erase block. That is, each block 408, 410, and 420 includes the minimum number of memory cells that are erased together. It should be understood that any other units of erase may also be used without limitation. Furthermore, in most embodiments, each block 408, 410, and 420 may be a closed block, an open block, and/or the like. For example, in some of the embodiments depicted below, block 420 ("BLOCK I") may be implemented as an open block.

Each memory erase block and/or each memory storage unit may include any number of memory cells. The design, size, and organization of a memory erase block may depend on the architecture, design, and application desired for the non-volatile memory device 104. The memory erase block may be a contiguous set of memory cells that may share a plurality of word lines and bit lines. For example, as shown in FIG. 4, the memory erase block such as block 420 may contain a set of NAND strings that may be accessed via the bit lines BL0-BLN−1, BLN, where N is any total number of bit lines used, and the word lines WL0, WL1, WL2-WLN, where N is any total number of word lines used.

As shown in the schematic illustration of block 420, four memory cells may be connected in series to form a NAND string. Although four memory cells are depicted in FIG. 4 to be included in each NAND string, it should be understood that more or less than four memory cells may be used (including, by way of non-limiting example, 16, 32, 64, 128, 256 or another number or memory cells), without limitation. One terminal of the NAND string is connected to a corresponding bit line via a drain select gate (connected to select gate drain line SGD), and another terminal is connected to the source line via a source select gate (connected to select gate source line SGS). Although eight bit lines are shown in FIG. 4, it should be appreciated that any number of bit lines may also be used, without limitation. Additionally, as discussed above, the block may implement non-volatile storage technologies other than NAND flash memory.

Furthermore, each block 408, 410, and 420 is typically divided into a plurality of pages. In most embodiments, a page is a unit of programming. It should be understood that any other units of programming may also be used without limitation. One or more pages of data are typically stored in one row of memory cells. For example, one or more pages of data may be stored in memory cells connected to a common word line. One example of a page can be all of the data stored in the memory cells connected to a common word line and in a common block. Another example of a page is a fraction (e.g., ¼, ½, ⅓) of the memory cells connected to a common word line and in a common block or a fraction of the bits stored in those memory cells. A page includes user data and overhead data (also called system data). Overhead data typically includes header information and ECC calculated from the user data of the sector. The controller (or other component) calculates the ECC when data is being programmed into the array, and also checks it when data is being read from the array.

In many embodiments, the unit of erase is a memory erase block and the unit of programming and/or reading is a page. Other units of operation can also be used. Data can be stored/written/programmed, read, and/or erased a byte at a time, 1K bytes, 512K bytes, etc. In some embodiments, the memory devices (or structures) described herein may program, erase, and read at the same unit of operation. In other embodiments, the memory devices may program, erase, and read at different units of operation. For example, the memory device may program, erase, and read programs/writes and erases, while in other examples the memory device may only need to program/write, without the need to erase, because such device may program/write zeros and ones (or other data values) and may thus overwrite previously stored information.

For example, block 420 may be configured with any variety of memory cells, including, but not limited to, SLCs, MLCs, TLCs, QLCs, PLCs, and so on. In certain embodiments, the block 420 may be configured as a QLC block, where each memory cell may have sixteen abodes or program states per cell that stores and/or encodes four bits of data (4-bit data). In such embodiments, each 4-bit cell of the block 420 may include a lower bit, a middle bit, a top bit, and an upper bit, where a set of lower bits form a lower page (LP), a set of middle bits form a middle page (MP), a set of upper bits form an upper page (UP), and a set of top bits form a top page (TP). For example, block 420 may include a QLC page having the following logical pages: a lower page, a middle page, an upper page, and a top page, where these four pages may be allocated to one word line. Physical pages, in some embodiments, may be grouped or organized into logical pages, with each logical page comprising multiple physical pages.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. For example, the memory systems may use threshold voltage distributions for a memory cell array when each memory cell stores four bits of data. Other embodiments, however, may use other data capacities per memory cell (e.g., such as one, two, three, five bits of data per memory cell, and so on).

It should be understood that the exemplary embodiments depicted below may use a FBC reduction device (or module, circuitry, component, etc.), such as the FBC reduction device 150 depicted in FIGS. 1A-B, 2, and 3A-B, to substantially increase the data retention of any type and number of blocks, such as block 408, 410, and 420 depicted above in FIG. 4, using soft program operations that significantly reduce the FBCs of any type and number of word lines in those respective blocks. That is, in these embodiments described below, the FBC reductive device 150 may include a program component that enables one or more programming operations to substantially reduce the FBCs of one or more boundary word lines in the block 420. For example, the exemplary embodiments described below may provide soft and/or soft-fine programming operation schemes for the reduction of bit failures in the block 420 of the non-volatile memory device 104. As such, the FBC reduction device in conjunction with the soft program, in most embodiments, facilitate any of the storage structures, devices, and systems described herein for the reduction of bit failures and FBCs, as depicted below in FIGS. 5-9.

Figure 5:
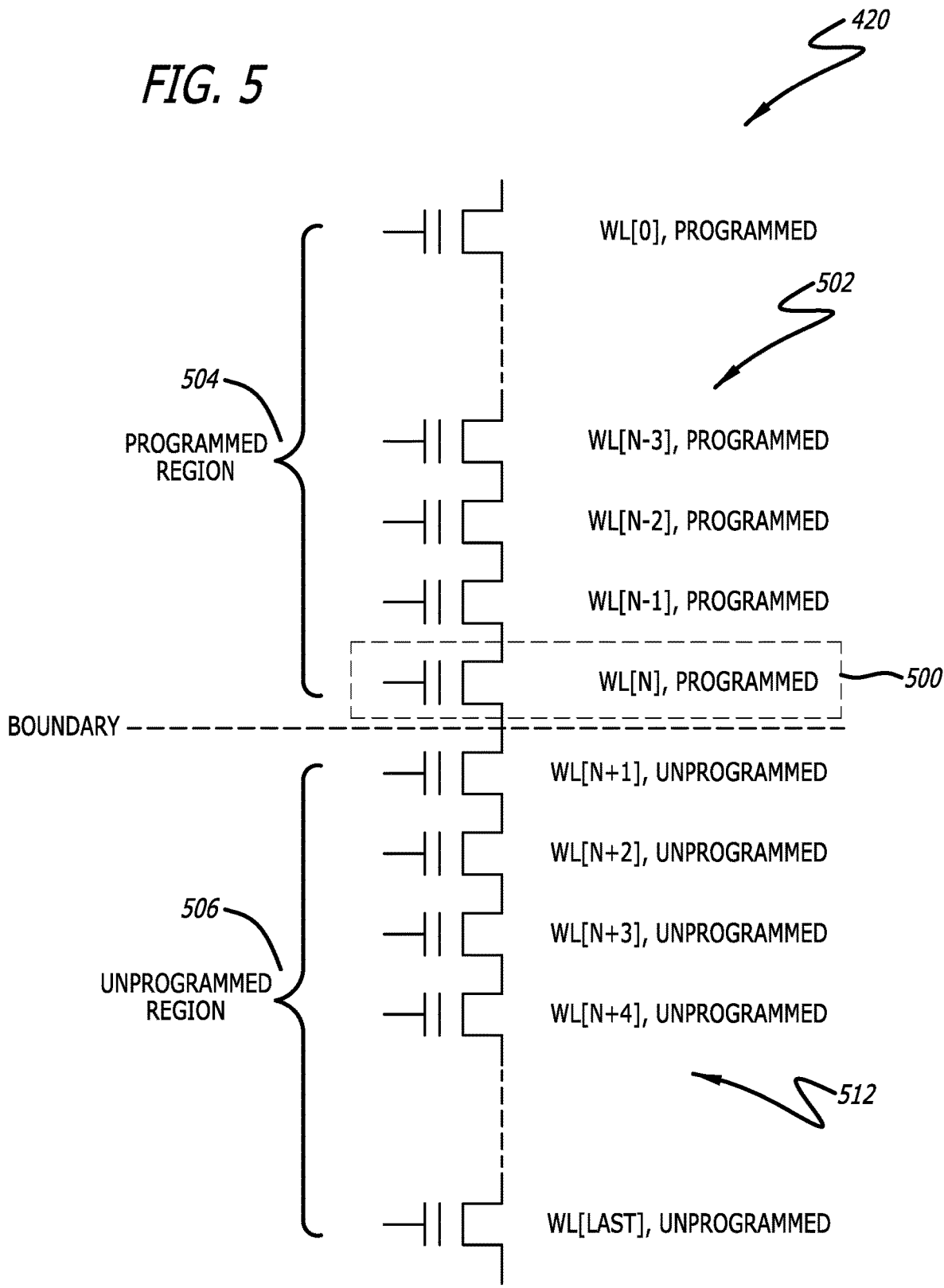
FIG. 5 is a schematic diagram illustration of a memory cell array structure with a plurality of word lines, one or more boundary word lines, a programmed region, and an unprogrammed region, in accordance with an embodiment of the present disclosure.

Referring now to FIG. 5, a schematic diagram illustration of a memory cell array structure with one or more boundary word lines 500, a plurality of programmed word lines 502 within a programmed region 504, and a plurality of unprogrammed word lines 512 in an unprogrammed region 506 is shown, in accordance with some embodiments. For example, the block 420 depicted in FIG. 5 may be a part of the memory cell array structure. Furthermore, in these embodiments, the block 420 depicted in FIG. 5 may be a part of the non-volatile memory device 104 depicted in FIGS. 1A, 2, and 3A-3B, where the non-volatile memory device 104 may include the block 420 in conjunction with a plurality of other blocks.

The illustrated schematic diagram may be configured to increase the data retention of the block 420 using one or more programming operations (e.g., one or more bit failure reduction programming operations, scheme, steps, etc.) that may significantly reduce the FBCs of one or more of the illustrated word lines, such as the boundary word line 500. In most embodiments, a FBC reduction device may be configured to perform these programming operations on the block 420, which may include, but are not limited to, pre-verify operations, soft and/or soft-fine program operations, and so on, as described below in greater detail.

As such, the FBC reduction device—in conjunction with any other storage devices and systems described herein—may implement those programming operations on the respective word lines 500, 502, and 512 of the block 420, which substantially reduces all of the FBCs associated with the boundary word line 500 and/or any other associated word lines in the block 420. Furthermore, using these programming operations, such as the pre-verify and soft/soft-fine programming operations, allows the FBC reduction device to prevent any programming voltage from the boundary word line 500 to leak and/or modify any of the neighboring, unprogrammed word lines 512. In most embodiments, the FBC reduction device described above in FIG. 5 may be substantially similar to the FBC reduction device(s) 150 depicted in FIGS. 1A-B, 2, and 3A-B.

In several embodiments, the one or more programming operations, such as the bit failure reduction programming operations described herein, may include, but are not limited to, a FBC count operation, a threshold operation, a pre-verify operation, a soft/soft-fine program operation, and so on, as depicted in greater detail below. For example, as depicted below in FIG. 8, the FBC reduction device 150 may include one or more components including, but not limited to, a FBC count component, a threshold component, a pre-verify component (or pre-verification component), a soft/soft-fine program component, a word line table component, and/or a program parameters component, which may be particularly utilized and configured to implement these programming operations on the illustrated word lines of the block 420.

Referring back to FIG. 5, according to most embodiments, the block 420 may be a QLC block, a PLC block, and/or the like (i.e., four bits or more per memory cell). Other embodiments, however, may use a SLC block, a MLC block, and/or a TLC block (i.e., three bits or less per memory cell). As depicted in FIG. 5, the block 420 may be an open and partially programmed block having a set of word lines that include the programmed word lines 502, the boundary word line 500, and the unprogrammed word lines 512. Furthermore, as shown with the schematic diagram of the block 420, the boundary word line 500 may be configured to separate the programmed word lines 502 in the programmed region 504 from the unprogrammed word lines 512 in the unprogrammed region 506.

For example, as shown in FIG. 5 with the horizontal dashed line, the boundary illustrates where the programmed word lines 502 are separated from the unprogrammed word lines 512. In this example, the boundary is between an unprogrammed word line at WL[N+1] and a programmed word line at WL[N], where the Nth word line is the last programmed word line, i.e., the boundary word line 500 is depicted as the word line "WL[N], PROGRAMMED" As such, all word lines before WL[N] are programmed (word lines WL[0] through WL[N−1]), and all word lines after WL[N] are unprogrammed, erased, partially programmed, or the like (word lines WL[N+1] through the last word line WL[LAST]). It should be understood that the word line WL[N] may be referred to as the boundary word line and the word line WL[N+1] may be referred to as the first open word line, where both (or either) may be used to identify the boundary as the memory controller or the like (e.g., mapping) may identify how many word lines of the open block have already been programmed. That is, the identification of the boundary (and thus the boundary word line) may be performed on an open block as the last programmed word line for the open block is known, thereby programming operations may be occurring at (or in reference to) the boundary word line 500.

For example, prior to closing the block 420 (i.e., the open and partially programmed block) during an initial or general programming operation, the FBC reduction device may be configured to check the FBC of the boundary word line 500. In most embodiments, the FBC reduction device may comprise one or more FBC count components that may be configured to count (or check, verify, etc.) each FBC for each memory cell and/or word line. Whereas, in other embodiments, the one or more FBC count component(s) may be particularly configured to only count a particular type/number of memory cells and/or word lines (i.e., configured to only count and verify a selected number or portion of word lines). It should be understood that the one or more FBC count components may be used to count each FBC count value for each page of each word line. For example, in many embodiments, the FBC count component may be configured to provide for any word line in a QLC block, such as the boundary word line 500 in the block 420, a first FBC count value for a first page (or LP) of the word line, a second FBC count value for a second page (or MP) of the word line, a third FBC count value for a third page (or UP) of the word line, and a fourth FBC count value for a fourth page (or UP) of the word line.

Accordingly, in most embodiments, the FBC count component of the FBC reduction device may be utilized to determine whether the boundary word line 500 has reached or exceeded a predetermined target threshold voltage (pass). For example, the FBC count component may be used for the determination that the initial (or general) programming operations were completed and successfully programmed as all selected memory cells and/or word lines, such as the boundary word line 500, were programmed and verified to or within their respective target threshold state(s), such that a status of "PASS" may be reported. However, for example, if the FBC count component determines that not all of the memory cells and/or word lines have reached their target threshold voltages (fail), then the FBC count component may be configured to count the number of memory cells and/or word lines that have not yet reached their respective target threshold voltage distribution. That is, the FBC count component may be configured to count the number of cells and/or word lines that have failed the verify process. Accordingly, the FBC count component may then be configured to determine (or identify) that such programming operations may be incomplete and partially programmed as all selected memory cells and/or word lines were not adequately programmed and verified to their respective target threshold states, such that a status of "FAIL" may be reported. It should be understood that such counting may be implemented by the FBC count component and/or any other storage devices and systems described herein, without limitation.

Furthermore, in most embodiments, the FBC reduction device may also have one or more threshold components that may be configured to identify (or determine) whether one or more FBCs of one or more word lines are greater than one or more predetermined thresholds. For example, in conjunction with the FBC count component, the threshold component may be configured to determine whether the boundary word line 500 in the block 420 is above or below a predetermined number of FBCs (i.e., the predetermined threshold), which may be indicative that the boundary word line 500 and any of the unprogrammed word lines 512 may encounter further bit failures, read disturb problems, and so on. As described below in greater detail, the predetermined threshold(s) may be varied and may depend on one or more parameters, such as the type, usage, and/or age of such device.

As such, continuing with the example described above, the threshold component may be configured, in some embodiments, to determine whether the FBC(s) of the boundary word line 500 are less or greater than the predetermined threshold (or threshold value), such that when the FBCs are less than (or below) their respective predetermined thresholds, the block 420 may continue to program the remaining unprogrammed word lines 512 without using any additional soft/soft-fine programming operations. Whereas, in other embodiments, when the FBCs of the boundary word line 500 are greater than (or above) their respective predetermined thresholds, the threshold component may be configured to trigger a pre-verify operation and a soft-fine program operation that may be performed on the programmed word lines 502 and the boundary word line 500 depicted in the block 420.

For example, typically, if any word lines have FBC values that exceed their threshold values, existing storage devices and systems may consider an open block to have failed and may trigger the relocation of the data of that failed open block to another block, but the unprogrammed word lines of that open block are typically not programmed and discarded due to the detected problems. However, in the embodiments described herein, the FBC reduction device may be configured to implement the pre-verify and soft/soft-fine programming operations on the programmed word lines 502 and the boundary word line 500 of the block 420 (i.e., when such block 420 may be open and partially programmed)—without triggering the relocation of data from the block 420 to another block, and without discarding the remaining unprogrammed word lines 512 that may later be programmed as discussed below.

As such, if determined that the FBC(s) of the boundary word line 500 are less than the predetermined threshold, the FBC reduction device may be configured to proceed with the initial programming operations and thus program the remaining unprogrammed word lines 512 in the unprogrammed region 506 of the block 420, in accordance with most embodiments. However, if determined that the FBC(s) of the boundary word line 500 are greater than the predetermined threshold, the FBC reduction device may be configured to trigger and implement the pre-verify operation on all programmed word lines 502 in the programmed region 504 and then the soft-fine program operation on the boundary word line 500 in the programmed region 504 (i.e., depicted as "WL[N], PROGRAMMED" in FIG. 5). As noted above, in most embodiments, the FBC reduction device may implement the soft-fine program operation on the boundary word line 500 if the block 420 is a QLC block, a PLC block, and so on. Alternatively, in some embodiments, the FBC reduction device may implement a soft program operation on the boundary word line 500 if the block 420 is a SLC block, a MLC block, and/or a TLC block.

In most embodiments, the pre-verify operation may be configured to identify the memory cells and/or word lines that have reached their respective programming states, and thereby to inhibit the corresponding bit lines of those identified cells/word lines, such that those identified cells/word lines are not over-programmed at the following soft and/or soft-fine programming step. Accordingly, in many embodiments, the soft-fine program operation may be configured to provide a substantial reduction of bit failures and FBCs for the block 420 by directly programming the boundary word line 500—as all of the other programmed word lines 502 are inhibited by the pre-verify operation—with the same data as the data that is still available in the respective source SLC block. For example, during the soft-fine program operation, the FBC reduction device may be configured to tunnel a particular number of electrons into a charge trapping layer (CTL) of the boundary word line 500 in order to concurrently maintain the particular number of electrons and threshold voltages that are needed for a status of "PASS" to be reported.

In most embodiments, after the soft-fine program operation has been completed and fully programmed the boundary word line 500, the FBC reduction device may be configured to disable (or stop) the pre-verify operation implemented on the programmed word lines 502 of the block 420. Lastly, as described above, the FBC reduction device may be configured to now proceed with the initial programming operations and thus program the remaining unprogrammed word lines 512 in the unprogrammed region 506 of the block 420, according to several embodiments. As such, in most embodiments, the remaining unprogrammed word lines 512 in the unprogrammed region 506 of the block 420 may be programmed, for example, using foggy-fine programming steps and/or any similar (or desired) programming steps. Also, although only one programmed region 504, one boundary word line 500, and one unprogrammed region 506 are shown in FIG. 5, it should be understood that any number (or combination) of programmed regions 504, boundary word lines 500, and unprogrammed regions 506 may be configured and programmed, without limitations.

Figure 6A:
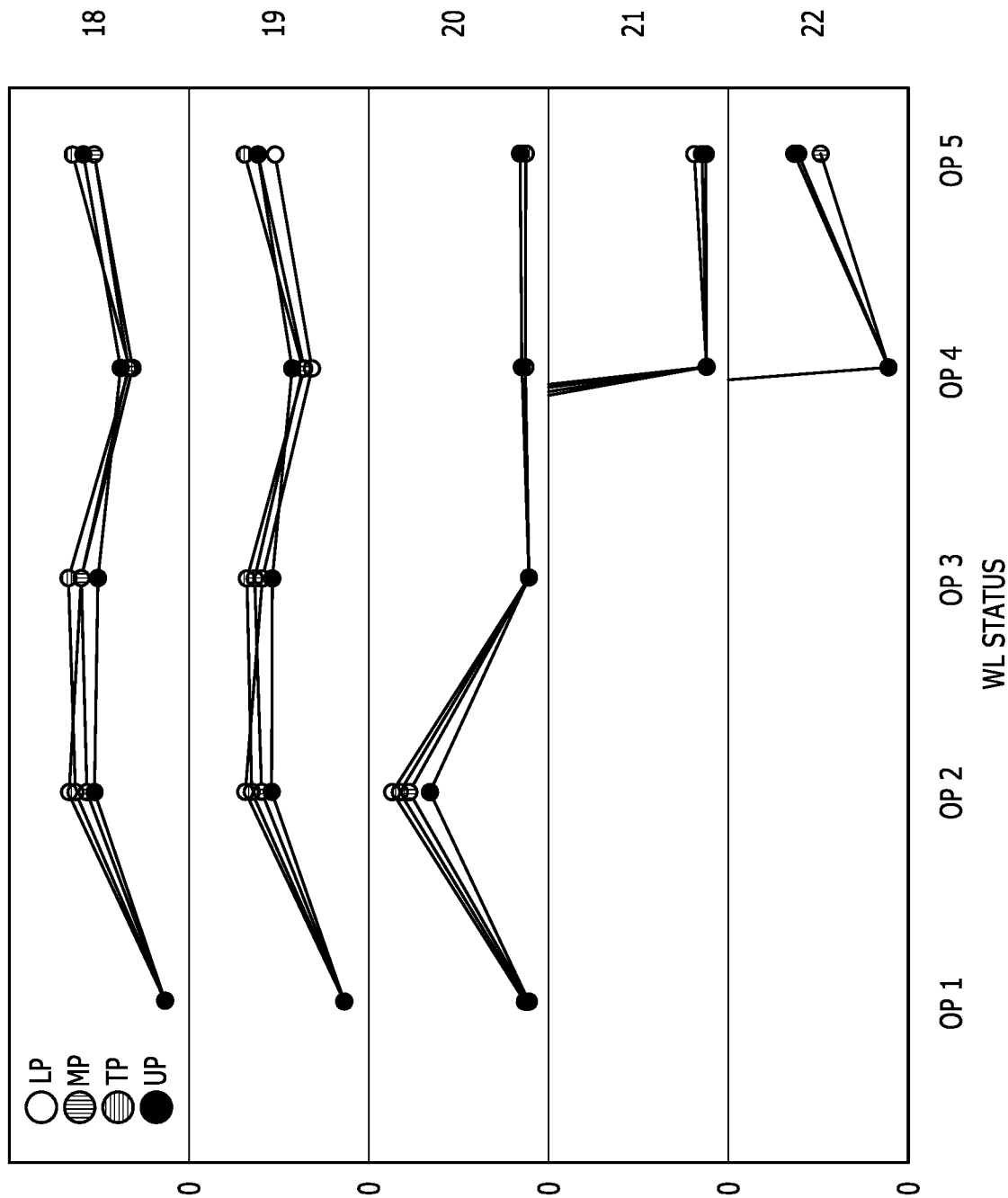
FIG. 6A is a diagram illustration of FBCs of a first boundary word line (BWL) and one or more word lines at various stages of a pre-verify operation, in accordance with an embodiment of the present disclosure.
Figure 6B:
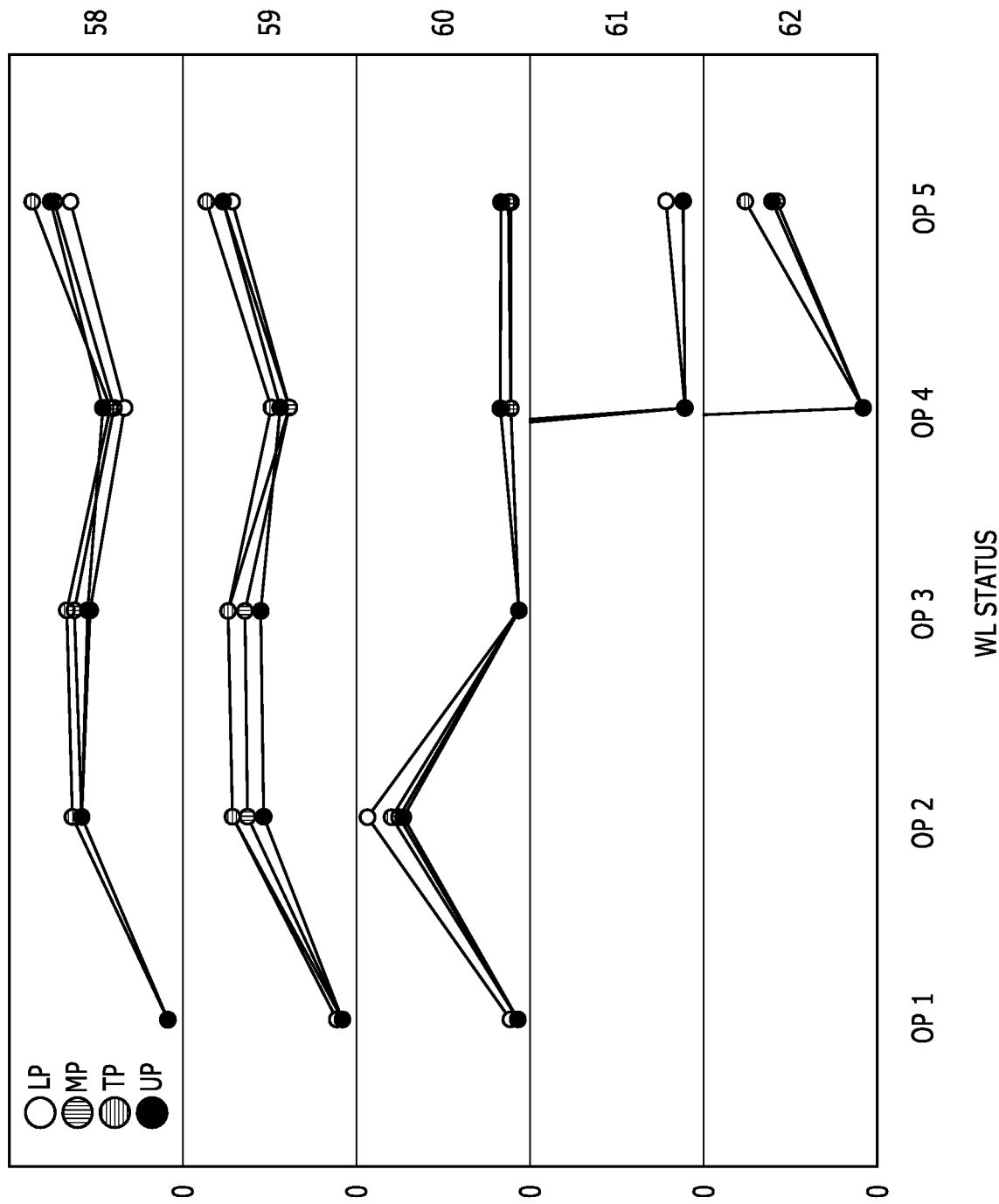
FIG. 6B is a diagram illustration of FBCs of a second BWL and one or more word lines at various stages of a pre-verify operation, in accordance with an embodiment of the present disclosure.

Referring now to FIGS. 6A-6B, a series of diagram illustrations of fail bit counts (FBCs) for a set of word lines (WL) with various WL status is shown, in accordance with some embodiments of the disclosure. In most embodiments, the diagram illustrations depicted in FIGS. 6A-B may be generated with the FBC reduction device 150 described above with regards to FIGS. 1A-C, 2, 3A-B, and 4-5. For example, the diagram illustrations in FIGS. 6A-B may be used to clearly show the reduction of FBCs for the boundary word lines (as compared to the other neighboring word lines) using the FBC reduction device 150 and/or any other storage devices and systems described herein. Furthermore, in the illustrated embodiments, one or more QLC block(s) may have been selected to measure the FBCs of the illustrated word lines. It should be understood that any number (or level) of cells may be used without limitation.

Each of the diagram illustrations in FIGS. 6A-B mainly depicts an exemplary graph that shows a boundary word line WL20/WL60 and a FBC (or a flip bit error rate measurement) for each page of the respective boundary word line, where the FBCs may be approximated by taking multiple reads and then measuring the respective FBC, by using the optimal read thresholds measured, and/or by implementing any other similar error measurement techniques. In particular, as described in greater detail below, the graphs in FIGS. 6A-B may depict that, as the respective blocks are kept open and partially programmed for an extended time period (i.e., as shown with the WL status at OP2), the FBCs of the boundary word lines WL20/WL60 are distinctly greater than the FBCs of the other programmed word lines WL18-WL19/WL58-WL59 due to the impact of the extended time period on the data retention of those open blocks.

For example, the diagram depicted in FIG. 6A may illustrate a first boundary word line (WL20) in relation to both the FBC and WL status of that first boundary word line at five different programming stages (OP1-OP5). Furthermore, the illustrated FBC in FIG. 6A may be depicted for each of the four pages (LP, MP, TP, UP) of each of the five word lines (WL18-WL22). Likewise, for example, the diagram depicted in FIG. 6B may illustrate a second boundary word line (WL60) in relation to both the FBC and WL status of that second boundary word line at five different programming stages (OP1-OP5). Furthermore, the illustrated FBC in FIG. 6B may be depicted for each of the four pages (LP, MP, TP, UP) of each of the five word lines (WL58-WL62).

As illustrated in FIGS. 6A-B, the WL status may be depicted utilizing five programming stages that may include, but are not limited to, the following operations (or steps): an open block creation (OP1), an open block DR (OP2), a soft-fine program (OP3), a block closure (OP4), and a close block DR (OP5). In particular, the five programming stages may be implemented to distinctly illustrate the significant reduction of FBCs for the first and second boundary word lines WL20/WL60 in FIGS. 6A-B due to (or based on) the soft-fine program operation implemented on the first and second boundary word lines WL20/WL60 (e.g., as shown with the respective WL status for WL20/WL60 at OP3-OP5).

At OP1, the open block creation step may include creating open block conditions by programming until WL20 in FIG. 6A and WL60 in FIG. 6B, such that WL20 and WL60 have a fine programming status, while the respective neighboring word lines WL21 and WL61 have a foggy programming status. At OP2, the open block DR step may include maintaining the respective open blocks idle for a predetermined time period, such that the boundary word line WL20/WL60 may depict FBCs that are greater than any of the other programmed word lines. For example, as shown with the WL status at OP2, the FBCs for WL20/WL60 in FIGS. 6A-B may be greater than the respective FBCs for WL18-WL19/WL58-WL59 in FIGS. 6A-B.

At OP3, the soft-fine program step may include implementing at least a pre-verify operation and a soft-fine program operation on the boundary word lines WL20/WL60. For example, the pre-verify step may identify a programmed region in which all of the programmed cells have reached the desired programming state (e.g., WL18-WL20 in FIG. 6A and WL58-WL60 in FIG. 6B) and may then inhibit the corresponding bit lines of the identified region, such that those programmed cells within the identified region may not be over-programmed at the following soft-fine (or soft) programming operation. Meanwhile, the soft-fine program operation may be performed directly on the boundary word lines WL20/WL60, such that the boundary word lines WL20/WL60 may be programmed with the same data that is available in the corresponding source SLC blocks. As such, as shown with the WL status at OP3, the FBCs for WL20/WL60 in FIGS. 6A-B have drastically lowered in relation to the FBCs for WL20/WL60 at OP2.

At OP4, the block closure step may include disabling the pre-verify operation and then programming the remaining word lines in the open block (e.g., WL21-WL22 in FIG. 6A and WL61-WL62 in FIG. 6B). For example, after the boundary word lines WL20/WL60 have been programmed with the soft-fine program at OP3, the pre-verify operation may be disabled from inhibiting the cells and/or word lines in the programmed regions, and then the initial programming operations (e.g., foggy-fine programming operations) may proceed to program the remaining word lines in the unprogrammed regions, as shown with the programming of WL21-WL22 in FIG. 6A and WL61-WL62 in FIG. 6B. Although the initial programming operations may be depicted as foggy-fine programming operations, it should be understood that any other desired programming operations and/or schemes may be implemented, without limitation.

At OP5, the close block DR step may include retaining the data stored in the respective blocks idle for a predetermined time period, such that the FBCs for the boundary word lines WL20/WL60 are now substantially less than the FBCs for any other programmed word lines. Accordingly, the embodiments described herein may be further depicted in FIGS. 6A-B as the FBCs for the WL20/WL60 still remain substantially lower than the FBCs for any of the programmed word lines WL18-WL19 and WL21-WL22/WL58-WL59 and WL61-WL62 at OP4, OP5, and so on.

Although only one boundary word line (WL20/WL60) with four pages is shown in FIGS. 6A-B, it should be understood that any number of boundary word lines with any number of pages may be implemented, without limitations. Also, although five programming operations are depicted in FIGS. 6A-B, it should be understood that more or less than five programming operations may be implemented for the reduction of FBCs, without limitations.

Figure 7A:
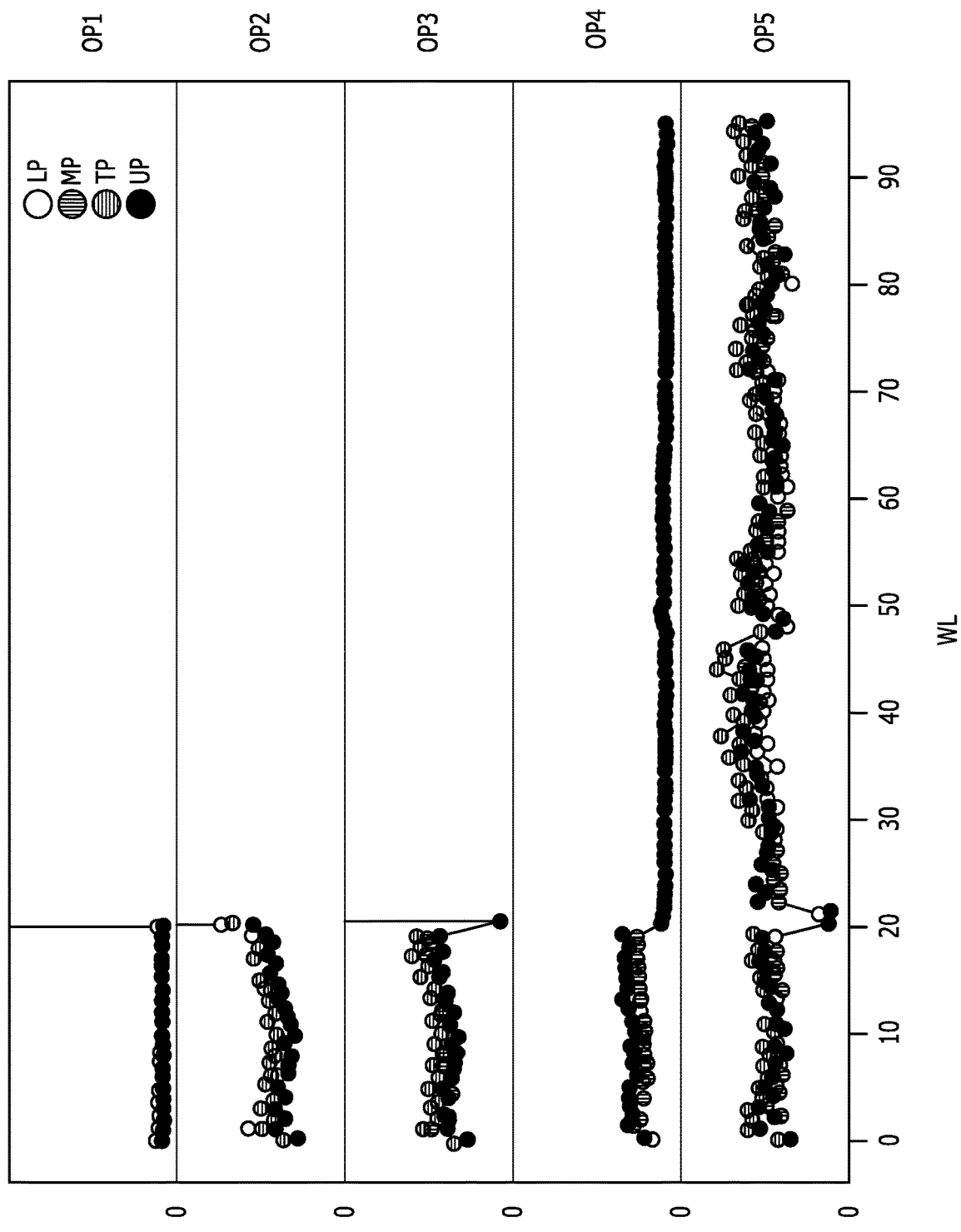
FIG. 7A is a diagram illustration of FBCs of a first BWL and one or more word lines at various stages of pre-verify and program operations, in accordance with an embodiment of the present disclosure.
Figure 7B:
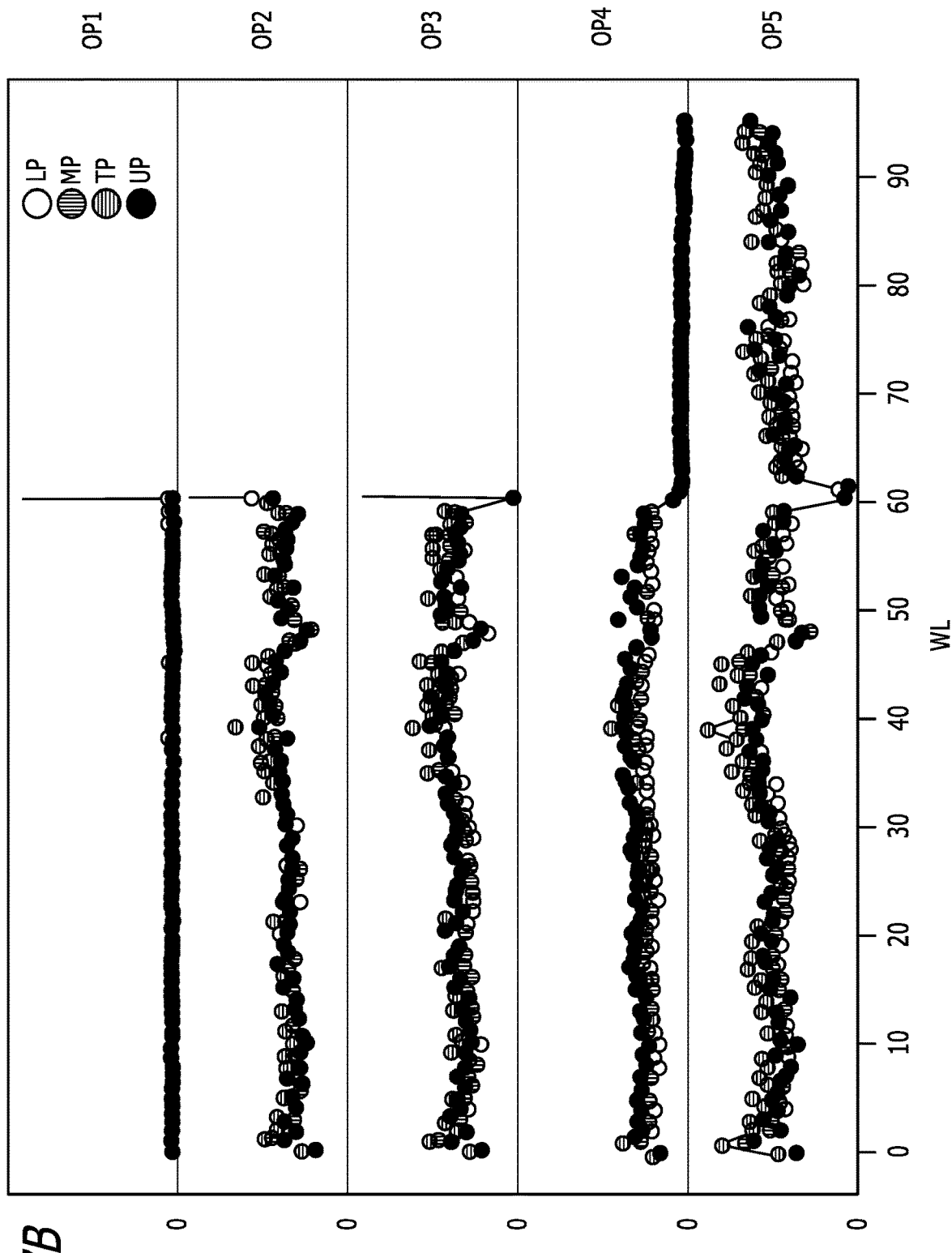
FIG. 7B is a diagram illustration of FBCs of a second BWL and one or more word lines at various stages of pre-verify and program operations, in accordance with an embodiment of the present disclosure.

Referring now to FIGS. 7A-7B, a series of diagram illustrations of FBCs for a set of word lines with various WL status is shown, in accordance with some embodiments of the disclosure. It should be understood that the diagram illustrations depicted in FIGS. 7A-B may be similar to the diagram illustrations depicted in FIGS. 6A-B, with the exception that the horizontal axis in FIGS. 7A-B is now used to illustrate the WLs and not the WL status as illustrated in FIGS. 6A-B. That is, the diagram illustrations in FIGS. 7A-B may depict the FBCs in relation the word line number of each word line at each processing stage. This facilitates in showing the comparison between the boundary word lines WL20/WL60 and all other word lines within the open blocks. In particular, as described above, the exemplary graphs in FIGS. 7A-B may mainly depict that, as the boundary word lines WL20/WL60 are programmed using the soft-fine program (i.e., as shown with the WL status at OP3), the FBCs of the boundary word lines WL20/WL60 maintain a substantially lower FBC value as compared to the FBC value for each of the other programmed word lines shown at the WL status OP3, OP4, and OP5.

As described above, in most embodiments, the diagram illustrations depicted in FIGS. 7A-B may be generated with the FBC reduction device 150 described above with regards to FIGS. 1A-C, 2, 3A-B, and 4-5. For example, the diagram illustrations in FIGS. 7A-B may be used to clearly show the reduction of FBCs for the boundary word lines (as compared to the other neighboring word lines) using the FBC reduction device 150 and/or any other storage devices and systems described herein. Furthermore, in the illustrated embodiments, one or more QLC block(s) may have been selected to measure the FBCs of the illustrated word lines. It should be understood that any number (or level) of cells may be used without limitation.

The diagram depicted in FIG. 7A may illustrate a first boundary word line (WL20) in relation to both the FBC and WL status of that first boundary word line at five different programming stages (OP1-OP5). Furthermore, the illustrated FBC in FIG. 7A may be depicted for each of the four pages (LP, MP, TP, UP) of each of the five word lines (WL18-WL22). Likewise, the diagram depicted in FIG. 7B may illustrate a second boundary word line (WL60) in relation to both the FBC and WL status of that second boundary word line at five different programming stages (OP1-OP5). Furthermore, the illustrated FBC in FIG. 7B may be depicted for each of the four pages (LP, MP, TP, UP) of each of the five word lines (WL58-WL62). In particular, the five programming stages may be implemented to distinctly illustrate the significant reduction of FBCs for the first and second boundary word lines WL20/WL60 in FIGS. 7A-B due to (or based on) the soft-fine program operation implemented on the first and second boundary word lines WL20/WL60. For example, as shown in FIGS. 7A-B, the respective FBCs for WL20/WL60 may substantially drop during the WL status shown at OP3; and thereafter, even after programming the remaining WLs as shown at OP4, the respective FBCs for WL20/WL60 remain lower than any other programmed word lines as shown with the WL status at OP3-OP5.

Figure 8:
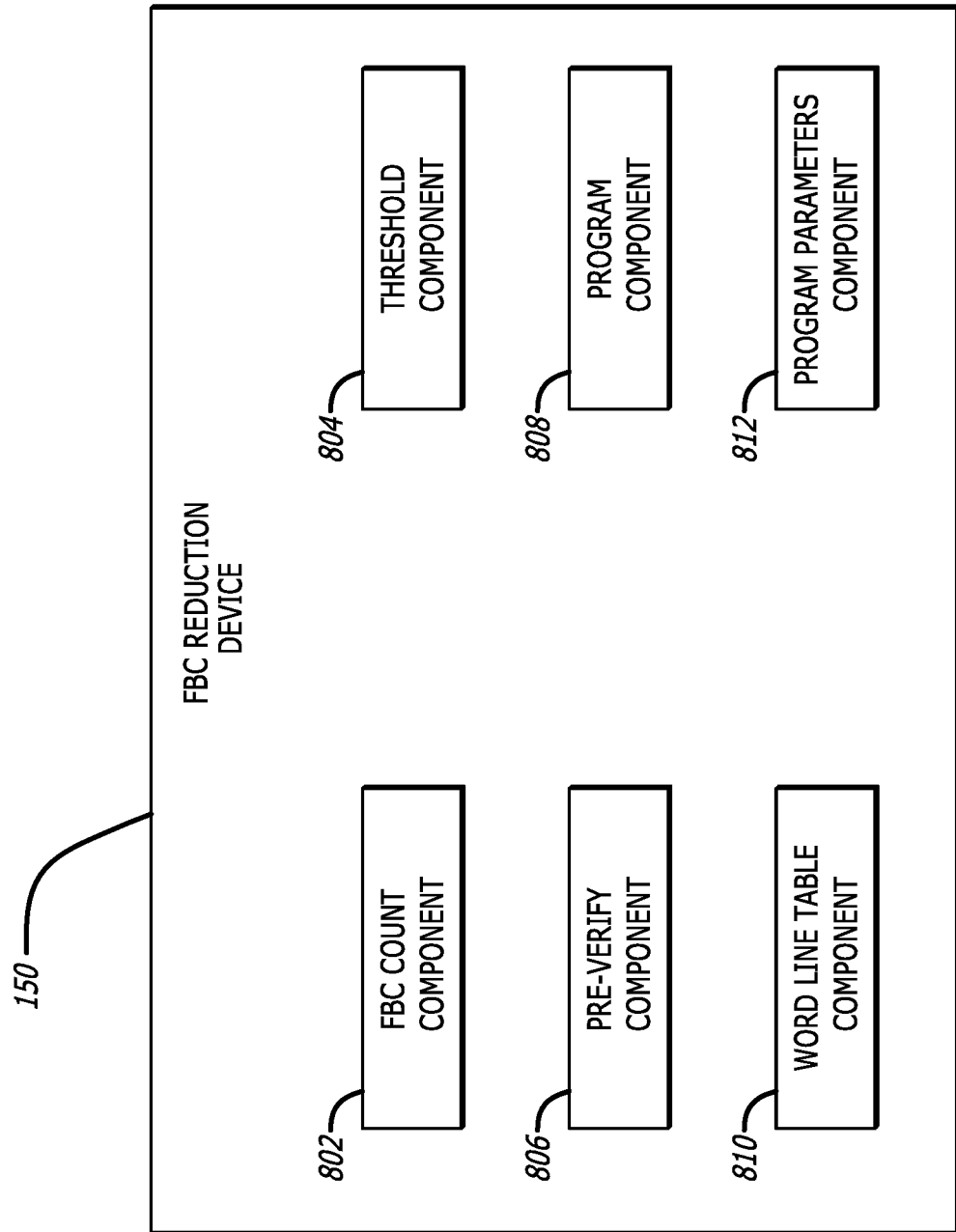
FIG. 8 is an exemplary block diagram illustration of a FBC reduction component, in accordance with an embodiment of the present disclosure.

Referring now to FIG. 8, an exemplary block diagram illustration of a FBC reduction device 150 is shown, in accordance with embodiments of the disclosure. For example, the FBC reduction device 150 may be a part of the non-volatile memory device 104 depicted in FIGS. 1A-B, 2, and 3A-B. The FBC reduction device 150 depicted in FIG. 8 may be substantially similar to the one or more FBC reduction devices 150 depicted above in FIGS. 1A-B, 2, and 3A-B.

In many embodiments, the FBC reduction device 150 may include, but is not limited to, a FBC count component 802, a threshold component 804, a pre-verify component 806 (or pre-verification component), a program component 808 (or soft/soft-fine program), a word line table component 810, and a program parameters component 812. Although six components are depicted in FIG. 8, it should be understood that any number of components may be utilized by the FBC reduction device 150, without limitation. It should also be understood that one or more components depicted in FIG. 8 may be combined, omitted, modified, and/or replaced in the FBC reduction device 150, without limitation.

In most embodiments, the FBC count component 802 may be configured to count (or check, verify, etc.) each FBC for each memory cell (and/or word line). Whereas, in some embodiments, the FBC count component 802 may be particularly configured to only count a particular type/number of memory cells (i.e., configured to only count and verify a selected number of memory cells). Also, in many embodiments, the FBC count component 802 may be configured to count and determine a status of those memory cells in conjunction with the word line table component 810, the threshold component 804, and/or any other similarly related component.

For example, in many embodiments, the FBC count component 802 may be configured to determine whether all the memory cells have reached their target threshold voltages (pass), where the target threshold voltages may be configured with the threshold component 804 described below in greater detail. If so, according to those embodiments, the FBC count component 802 may determine that the programming operations are completed and successfully programmed as all selected memory cells were programmed and verified to their target states, such that a status of "PASS" may be reported and stored in the word line table component 810 and/or any other similar data table.

Meanwhile, if, in these embodiments, it is determined that not all of the memory cells have reached their target threshold voltages (fail), then the FBC count component 802 may be configured to count the number of memory cells that have not yet reached their respective target threshold voltage distribution. That is, the FBC count component 802 may count the number of cells that have failed the verify process. As such, the FBC count component 802 may thus identify that the programming operations are not completed and partially programmed as all selected memory cells were not adequately programmed and verified to their target states, such that a status of "FAIL" may be reported and stored in the word line table component 810. It should be understood that this counting may also be done by one or more other storage structures and/or devices described herein, without limitation.

Furthermore, according to many embodiments, the threshold component 804 may be configured to identify (or determine) whether a FBC of a word line is greater than a predetermined threshold. For example, in conjunction with the FBC count component 802, the threshold component 804 may be configured to identify whether a boundary word line in an open block is above or below a predetermined number of FBCs, which may be indicative that the boundary word line and any unprogrammed word lines in that block may encounter further bit failures, read disturb problems, and/or the like. It should be understood that the predetermined threshold(s) may be varied and may depend on any number of parameters, such as the type, usage, and/or age of the memory device, without limitation. For example, older memory devices may have a higher threshold as such devices may be more prone to errors. Also, it should be understood that any other empirical data may be used for determining the predetermined threshold(s), without limitation. As such, in some embodiments, the predetermined threshold may be determined (or selected) based on an initial characterization of each memory generation, as the behavior of one generation of memory devices may be more or less similar.

Furthermore, in most embodiments, the threshold component 804 may be configured to provide a predetermined threshold value, such that when the FBC value is below the predetermined threshold value, the open block may continue to be programmed for the remaining word lines without using any additional soft programming operations. Whereas, in these embodiments, when the FBC value is greater than the predetermined threshold value, the threshold component 804 may trigger a pre-verify operation and a soft (or soft-fine) program operation for that block.

As described above, if any word lines have FBC values that exceed their threshold values, the existing storage devices and systems may generally consider the open block to have failed and may trigger relocation of the data of that failed open block to another block, but the unprogrammed word lines of that open block are left and not programmed due to the detected problems. However, the embodiments described herein may be configured to implement the pre-verify and soft/soft-fine program operations on the programmed word lines of that failed open block—without triggering the relocation of data from one block to another block—and thereafter, as the FBCs of the respective word lines(s) are lowered, the remaining word lines may be programmed with the initial programming operations, which thereby enables a reduction in bit failures, overall programming time, and write amplification, and an improvement in overall performance and over any existing storage schemes.

As noted above, in several embodiments, the pre-verify component 806 may be configured to perform a pre-verify operation on a programmed region of an open block. For example, the pre-verify component 806 may be configured to perform the pre-verify operation on the programmed region of the open block. In most embodiments, the pre-verify operation may identify the memory cells and/or word lines that have reached the desired programming state and inhibits the corresponding bit lines of those identified cells and/or word lines, such that those cells and/or word lines are not over-programmed at the following soft (or soft-fine) programming step.

In several embodiments, the program component 808 may be configured to program one or more word lines in a block. For example, in most embodiments, the program component 808 may be configured to program any boundary word lines in an open block (and/or a closed block based on one or more programming parameters that may need to tuned or the like). As described herein, the program component 808 may implement one or more soft program operations based on the level/number of cells of the block. For example, the program component 808 may be configured to program a QLC/PLC block using one or more soft-fine program operations. In another example, the program component 808 may be configured to program a SLC/MLC/TLC block using one or more soft program operations. Furthermore, in some embodiments, the program component 808 may be configured to perform the soft-fine program operations on the boundary word lines of the open QLC blocks with the same data as the data that is available in the respective source SLC blocks. According to several embodiments, the program component 808 may be configured to tunnel electrons into the CTL of the boundary word lines during the soft-fine program operations. This may thereby allow, in most embodiments, the program component 808 to maintain the required number of electrons needed for those word lines in order to hold their respective threshold voltages below the predetermined thresholds. As such, the program component 808 may facilitate the programmed word lines and any boundary word lines in the programmed region, and all of the unprogrammed word lines in the unprogrammed region, by preventing any further programming voltage leaks that modify any neighboring word lines and thus not allowing the failed open block from increasing and triggering additional bit failures (or FBCs).

In several embodiments, the word line table component 810 may be configured to store any particular data point and status obtained from the respective memory blocks. For example, the word line table component 810 may store the status (pass/fail) of any of the respective cells and/or word lines. Furthermore, in some embodiments, the data points stored in the word line table component 810 may include, but are not limited to, a FBC count number, a number of pre-verify operations, a number of read/write operations, and so on. For other embodiments, the word line table component 810 may also store a status of the particular programming operation used to program those particular cells and/or word lines, such as a soft-fine program operation, a soft program operation, and/or the like.

Lastly, in several embodiments, the program parameters component 812 may be configured to provide one or more parameters that may be tuned, controlled, and optimized based on the desired application and design of the respective storage device, which thereby facilitates one or more of the FBC count operations, the threshold operations, the pre-verify operations, and/or the soft and/or soft-fine program operations described above. For example, the program parameters component 812 may enable tuning the one or more parameters which may include, but are not limited to, a delta voltage program, a predetermined number of pre-verify operations, a threshold voltage, a pass/fail voltage (or voltage range), a number of program counts, and/or any other related parameters and programming voltages (or pulses).

Figure 9:
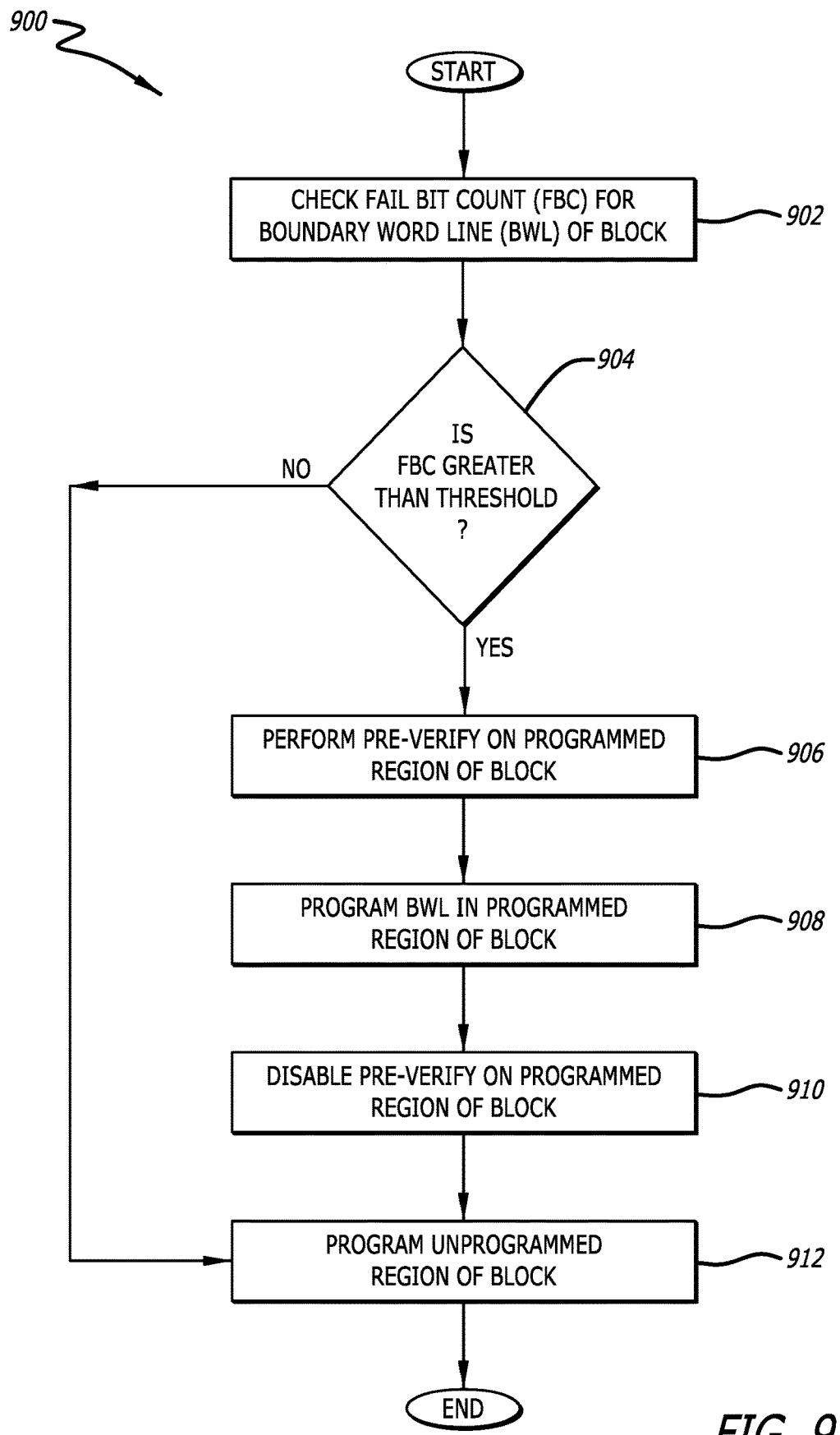
FIG. 9 is a flowchart illustration of a process for dynamically handling and improving data retention in open blocks with a FBC reduction component in accordance with embodiments of the present disclosure.

Referring now to FIG. 9, a high-level flowchart of an exemplary process 900 for increasing data retention of a block is shown, in accordance with some embodiments. In particular, in most embodiments, the process 900 may be configured to increase the data retention of the block using one or more soft (or soft-fine) program operations that significantly reduce the FBCs of one or more word lines in the block. The process 900 in FIG. 9 may depict one or more illustrations of one or more process flows described herein. For example, the process 900 may be configured to increase data retention and reduce FBCs of the block with a FBC reduction device that may be substantially similar to the FBC reduction device 150 depicted in FIG. 8 and any of the other figures above. It should be understood that any process steps depicted below may be implemented at the same time as any other process steps, and/or that any process steps depicted below may be interchanged with any other process steps in relation to the sequence of the process 900 flow, without limitations.

At block 902, the process 900 may check a FBC for a boundary word line of an open block during a programming operation or the like. For example, prior to closing the open or partially programmed block during programming similar to the block 420 depicted in FIG. 5, the FBC reduction device 150 may be configured to check the FBC of the boundary word line in that block with the FBC count component 802 depicted in FIG. 8, where the boundary word line may be substantially similar to the boundary word line 500 depicted in FIG. 5. At block 904, the process 900 may determine whether the FBC of the boundary word line is greater than a predetermined threshold. For example, the FBC reduction device 150 may be configured to utilize the word line table component 810 depicted in FIG. 8 to determine whether the FBCs of any particular boundary word lines of any particular open block is greater than the predetermined threshold implemented by the threshold component 804 depicted in FIG. 8. That is, if the FBC is less than the predetermined threshold value, the process 900 may proceed to block 912 to program the remaining word lines of the open block in accordance with most embodiments. However, if the FBC is greater than the predetermined threshold value, then the process 900 may continue to proceed to block 906.

At block 906, the process 900 may perform a pre-verify operation on a programmed region of the open block. For example, the FBC reduction device 150 may be configured to perform the pre-verify operation on the programmed region of the open block, such as the programmed region 504 depicted in FIG. 5, where the pre-verify operation may be implemented by the pre-verify component 806 depicted in FIG. 8. That is, in most embodiments, the pre-verify operation may identify the memory cells that have reached the desired programming state and inhibits the corresponding bit lines, such that those memory cells are not over-programmed at the following soft (or soft-fine) programming step.

At block 908, the process 900 may program the boundary word line in the programmed region of the open block. For example, the FBC reduction device 150 may be configured to program the boundary word line in the programmed region of the open block with the program component 808 depicted in FIG. 8. That is, in some embodiments, the program component 808 in FIG. 8 may implement a soft-fine program operation on the boundary word line if the open block is a QLC block. Whereas, in other embodiments, the program component 808 in FIG. 8 may implement a soft program operation on the boundary word line if the open block is a SLC block and/or a TLC block. For example, in some embodiments, the process 900 may implement the soft-fine program on the boundary word lines of the open QLC blocks with the same data as the data that is still available in the source SLC blocks. That is, the FBC reduction device 150 may be configured to tunnel electrons into the CTL of the boundary word lines during the soft-fine program operation to maintain the desired (or required) number of electrons and threshold voltages for those open block(s). Furthermore, as described above, the soft programming operations may be controlled and optimized with the program parameters component 812 depicted in FIG. 8. For example, the program parameters component 812 may provide one or more trim parameters which may be tuned (or modified) for even faster operations and improved performance based on the desired application and/or design of the non-volatile memory device 104, where the trim parameters may include, but are not limited to, a delta of program voltage(s), a predetermined number of pre-verify, a pass voltage, a program counter, a pulse voltage, a variety of threshold voltages, and so on.

At block 910, the process 900 may disable the pre-verify operation on the programmed region of the open block. For example, the FBC reduction device 150 may be configured to disable the pre-verify operation on the programmed region of the open block with at least the pre-verify component 806 and/or the program component 808 in FIG. 8. At block 912, the process 900 may now continue with the initial programming operation and program an unprogrammed region of the open block. For example, the FBC reduction device 150 may be configured to disable the pre-verify on the programmed region 504 of the block 420 and then continue to program the remaining word lines within the unprogrammed region 506 depicted in FIG. 5. That is, in most embodiments, the remaining unprogrammed word lines of block 420 may be programmed, for example, using the usual foggy-fine programming steps and/or any similar higher-density programming steps.

Information as shown and described in detail herein is fully capable of attaining the above-described object of the present disclosure, the presently preferred embodiment of the present disclosure, and is, thus, representative of the subject matter that is broadly contemplated by the present disclosure. The scope of the present disclosure fully encompasses other embodiments that might become obvious to those skilled in the art, and is to be limited, accordingly, by nothing other than the appended claims. Any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims.

Moreover, no requirement exists for a system or method to address each and every problem sought to be resolved by the present disclosure, for solutions to such problems to be encompassed by the present claims. Furthermore, no element, component, or method step in the present disclosure is intended to be dedicated to the public regardless of whether the element, component, or method step is explicitly recited in the claims. Various changes and modifications in form, material, work-piece, and fabrication material detail can be made, without departing from the spirit and scope of the present disclosure, as set forth in the appended claims, as might be apparent to those of ordinary skill in the art, are also encompassed by the present disclosure.

What is claimed is:

1. A method for managing a block in a storage device, comprising:
    accessing a failed bit count (FBC) for a boundary word line in the block;
    determining whether the FBC of the boundary word line exceeds a predetermined threshold;
    in response to the FBC of the boundary word line exceeding the predetermined threshold, performing at least one pre-verify operation on one or more of the non-boundary word lines in the block;
    programming the boundary word line; and
    programming any remaining unprogrammed word lines within the block.

2. The method of claim 1, wherein the block has one or more programmed word lines in a programmed region, and one or more unprogrammed word lines in an unprogrammed region.

3. The method of claim 2, wherein the boundary word line separates the programmed word lines of the programmed region from the unprogrammed word lines of the unprogrammed region.

4. The method of claim 3, wherein the method further includes programming the boundary word line with first data equal to second data that is programmed in a second block in the storage device.

5. The method of claim 4, block wherein the second block comprises a source block, and wherein the source block comprises at least one or more of a source single-level cell (SLC) block, a multi-level cell (MLC) block, a triple-level cell (TLC) block, a quad-level cell (QLC) block, or a penta-level cell (PLC) block.

6. The method of claim 4, wherein the second block is a block in which an error was previously detected.

7. The method of claim 3, wherein the at least one pre-verify operation is performed on the programmed region of the block.

8. The method of claim 7, wherein the method further includes, in response to programming the boundary word line, disabling the at least one pre-verify operation on the programmed region of the block.

9. The method of claim 1, wherein the block is an open block.

10. The method of claim 1, wherein the programmed first data of the word line is configured by a soft program component.

11. The method of claim 10, wherein the soft program component comprises a soft-fine programming operation and a soft programming operation.

12. A storage device, comprising:
    one or more memories; and one or more controllers configured to:
- access one or more failed bit counts (FBCs) for one or more pages of a boundary word line in a block;
- determine whether any of the FBCs of any of the pages of the boundary word line exceed a predetermined threshold;
- in response to at least one FBC of at least one page of the boundary word line exceeding the predetermined threshold, perform pre-verify operations on one or more of the programmed word lines in the programmed region;
- programming the boundary word line; and
- programming any remaining unprogrammed word lines within the block.

13. The storage device of claim 12, wherein performing the pre-verify operations on one or more of the programmed word lines in the programmed region is done in response to all FBCs of all pages of the boundary word line exceeding the predetermined threshold.

14. The storage device of claim 12, wherein the boundary word line is programmed with data copied from a source block.

15. The storage device of claim 14, wherein the source block comprises at least one or more of a SLC block, a MLC block, a TLC block, a QLC block, a PLC block, and any block with a predetermined error.

16. The storage device of claim 14, wherein the boundary word line programming is configured by a soft program component.

17. The storage device of claim 16, wherein the soft program component comprises a soft-fine programming operation and a soft programming operation, and wherein the soft program component includes one or more tunable parameters that are configured to control both the soft and soft-fine programming operations.

18. The storage device of claim 17, wherein tunable parameters include trim parameters.

19. The storage device of claim 12, wherein the programming any remaining unprogrammed word lines within the block is done with a foggy-fine programming method.

20. A storage device, comprising:
- a failed bit count (FBC) reduction device;
- one or more memories communicatively coupled to the FBC reduction device; and
- one or more controllers communicatively coupled to at least one or more of the memories and the FBC reduction device, wherein the FBC reduction device comprises:
  - an FBC count component configured to access a FBC for a word line in a block;
  - a threshold component configured to determine whether the FBC of the word line exceeds a predetermined threshold;
  - a pre-verify component configured to, in response to the FBC of the word line exceeding the predetermined threshold, perform pre-verify operations on one or more programmed word lines within the block;
  - a soft program component configured to program the word line with data equal to data received from a source block; and
  - a program component configured to program the unprogrammed word lines in the unprogrammed region of the block.

* * * * *